US012768749B2

(12) United States Patent
Komori

(10) Patent No.: US 12,768,749 B2
(45) Date of Patent: Oct. 20, 2026

(54) MOTOR BEARING WEAR MONITORING DEVICE, SETTING METHOD FOR MOTOR BEARING WEAR MONITORING DEVICE, AND SETTING PROGRAM

(71) Applicant: NIKKISO CO., LTD., Tokyo (JP)

(72) Inventor: Chihiro Komori, Tokyo (JP)

(73) Assignee: NIKKISO CO., LTD., Tokyo (JP)

( * ) Notice: Subject to any disclaimer, the term of this patent is extended or adjusted under 35 U.S.C. 154(b) by 161 days.

(21) Appl. No.: 18/859,637

(22) PCT Filed: Apr. 17, 2023

(86) PCT No.: PCT/JP2023/015291
§ 371 (c)(1),
(2) Date: Oct. 24, 2024

(87) PCT Pub. No.: WO2023/210419
PCT Pub. Date: Nov. 2, 2023

(65) Prior Publication Data

US 2026/0202281 A1 Jul. 16, 2026

(30) Foreign Application Priority Data

Apr. 27, 2022 (JP) ................................ 2022-073021

(51) Int. Cl.
*F16C 17/24* (2006.01)
*G01M 13/04* (2019.01)
(Continued)

(52) U.S. Cl.
CPC ........... *G01M 13/04* (2013.01); *F16C 17/246* (2013.01); *G01R 33/00* (2013.01); *H02K 11/20* (2016.01);
(Continued)

(58) Field of Classification Search
CPC .... F16C 17/24; F16C 17/246; F16C 2233/00; F16C 1380/26; H02K 11/20; G01R 33/00; G01M 13/04
See application file for complete search history.

(56) References Cited

U.S. PATENT DOCUMENTS 5,955,880 A * 9/1999 Beam .................... G01M 13/04
324/207.17
6,114,966 A * 9/2000 Eguchi ................... G08B 21/00
73/114.81

FOREIGN PATENT DOCUMENTS

JP H10-080103 A 3/1998
JP H11-148819 A 6/1999
(Continued)

OTHER PUBLICATIONS

Mar. 26, 2026 European Extended Search Report for corresponding EP23796162.8.

(Continued)

*Primary Examiner* — Douglas X Rodriguez
*Assistant Examiner* — Kendrick X Liu
(74) *Attorney, Agent, or Firm* — WCF IP

(57) ABSTRACT

A motor bearing wear monitoring device (5, 5A) monitors wear state of bearings (32, 33) by using detection coils (C1 to C8). The device includes a division value calculation unit (530) calculating a division value by dividing a signal voltage of a first combined signal of a pair of thrust detection coils by a signal voltage of a second combined signal of another pair of thrust detection coils, among the detection coils, or by dividing the signal voltage of the second combined signal by the signal voltage of the first combined signal, and an initial value setting unit (531) setting an initial value indicating a position of the rotor in an unworn state, based on the division value at the initial position, the initial
(Continued)

position being a position of the rotor in the thrust direction in the unworn state in which the bearings are not worn.

9 Claims, 18 Drawing Sheets

(51) Int. Cl.
*G01R 33/00* (2006.01)
*H02K 11/20* (2016.01)
(52) U.S. Cl.
CPC ...... *F16C 2233/00* (2013.01); *F16C 2380/26* (2013.01)

(56) References Cited

FOREIGN PATENT DOCUMENTS

| | | | |
|---|---|---|---|
| JP | H11-150917 | A | 6/1999 |
| JP | 2002-051504 | A | 2/2002 |
| JP | 2005-204415 | A | 7/2005 |
| JP | 2006-340520 | A | 12/2006 |

OTHER PUBLICATIONS

PCT/JP2023/015291, International Search Report, Jul. 4, 2023.
PCT/JP2023/015291, Written Opinion, Jul. 4, 2023.

* cited by examiner

MOTOR BEARING WEAR MONITORING DEVICE, SETTING METHOD FOR MOTOR BEARING WEAR MONITORING DEVICE, AND SETTING PROGRAM

TECHNICAL FIELD

The present invention relates to a motor bearing wear monitoring device, a setting method for the motor bearing wear monitoring device, and a setting program.

BACKGROUND ART

A canned motor pump has a structure in which a pump and a motor are integrated and handling liquid does not leak. In general, a rotating structure portion of the canned motor pump (a rotor, a rotating shaft, a bearing, and an impeller) is sealed in a can filled with the handling liquid. Thus, the internal structure of the canned motor pump cannot be visually monitored from the outside. Accordingly, in order to efficiently operate the canned motor pump having such a structure, a device for monitoring a wear state of the bearing (hereinafter referred to as "monitoring device") is used (for example, see PTL 1).

The monitoring device (the motor bearing wear monitoring device) disclosed in PTL 1 monitors displacement of the rotor (the rotating shaft) in the radial direction and the thrust direction caused by bearing wear by using detection coils attached to both ends of the stator in the longitudinal direction and measuring a change in magnetic flux when the rotor rotates.

In such a monitoring device, deviation due to assembly tolerance and the like occurs between a mechanical initial position of the rotor in the thrust direction (a position at which the center of the rotor coincides with the center of the stator) and a magnetic center position of the detection coils in the thrust direction (a point at which the signal voltage values of the detection coils on the front side and the rear side coincide with each other, i.e., a magnetic center). The amount of deviation is a unique value that slightly varies from pump to pump. Thus, the signal voltage value in this initial position needs to be set for each pump as a value (an initial value) indicating the initial position of the rotor in a state where the bearings are not worn.

CITATION LIST

Patent Literature

[PTL 1] JP H10-080103 A

SUMMARY OF INVENTION

Technical Problem

In order to acquire the signal voltage value at the initial position, it is necessary to perform a test operation of the pump under a rated operating condition and measure a signal voltage value of a detection signal of the detection coil, for example. For this purpose, it is necessary to feed liquid close to the actual handling liquid (or pseudo-water). In this way, work effort and time are required to set the initial value.

The present invention is directed to providing a motor bearing wear monitoring device, a setting method for the motor bearing wear monitoring device, and a setting program that are capable of setting an initial value easily.

Solution to Problem

A motor bearing wear monitoring device according to one aspect of the present invention is a motor bearing wear monitoring device for monitoring a wear state of bearings that support a rotating shaft of a rotor by detecting a change in magnetic flux corresponding to a mechanical position change of the rotor with respect to a stator of a motor in a canned motor pump by using a plurality of detection coils attached to the stator, in which the plurality of detection coils includes a plurality of thrust detection coils that output the detection signals indicating the change in the magnetic flux in the thrust direction of the rotating shaft, and the motor bearing wear monitoring device includes a division value calculation unit that calculates a division value by dividing a signal voltage of a first combined signal obtained by combining the detection signals output from each of a pair of the thrust detection coils by a signal voltage of a second combined signal obtained by combining the detection signals output from each of another pair of the thrust detection coils among the plurality of thrust detection coils, or by dividing the signal voltage of the second combined signal by the signal voltage of the first combined signal; and an initial value setting unit that sets an initial value indicating a position of the rotor in an unworn state, based on the division value at the initial position, the initial position being a position of the rotor in the thrust direction in the unworn state in which the bearings are not worn.

A setting method for a motor bearing wear monitoring device according to one aspect of the present invention is a setting method for a motor bearing wear monitoring device for monitoring a wear state of bearings that support a rotating shaft of a rotor by detecting a change in magnetic flux corresponding to a mechanical position change of the rotor with respect to a stator of a motor in a canned motor pump by using a plurality of detection coils attached to the stator, in which the plurality of detection coils includes a plurality of thrust detection coils that output the detection signals indicating the change in the magnetic flux in the thrust direction of the rotating shaft, and the setting method includes a division value calculation step of calculating a division value by dividing a signal voltage of a first combined signal obtained by combining the detection signals output from each of a pair of the thrust detection coils by a signal voltage of a second combined signal obtained by combining the detection signals output from each of another pair of the thrust detection coils among the plurality of thrust detection coils, or by dividing the signal voltage of the second combined signal by the signal voltage of the first combined signal; and an initial value setting step of setting an initial value indicating a position of the rotor in an unworn state, based on the division value at the initial position, the initial position being a position of the rotor in the thrust direction in the unworn state in which the bearings are not worn.

A setting program for a motor bearing wear monitoring device according to one aspect of the present invention is a setting program to be executed by a processor included in a motor bearing wear monitoring device for monitoring a wear state of bearings that support a rotating shaft of a rotor by detecting a change in magnetic flux corresponding to a mechanical position change of the rotor with respect to a stator of a motor in a canned motor pump by using a plurality of detection coils attached to the stator, in which the plurality of detection coils includes a plurality of thrust detection coils that output the detection signals indicating the change in the magnetic flux in the thrust direction of the rotating shaft, and the setting program causes the processor to function as a division value calculation unit that calculates a division value by dividing a signal voltage of a first combined signal obtained by combining the detection signals output from each of a pair of the thrust detection coils by a signal voltage of a second combined signal obtained by combining the detection signals output from each of another pair of the thrust detection coils among the plurality of thrust detection coils, or by dividing the signal voltage of the second combined signal by the signal voltage of the first combined signal; and an initial value setting unit that sets an initial value indicating a position of the rotor in an unworn state, based on the division value at the initial position, the initial position being a position of the rotor in the thrust direction in the unworn state in which the bearings are not worn.

Advantageous Effects of Invention

The present invention is able to provide the motor bearing wear monitoring device, the setting method for the motor bearing wear monitoring device, and the setting program that are capable of setting an initial value easily.

DESCRIPTION OF EMBODIMENTS

Figure 1:
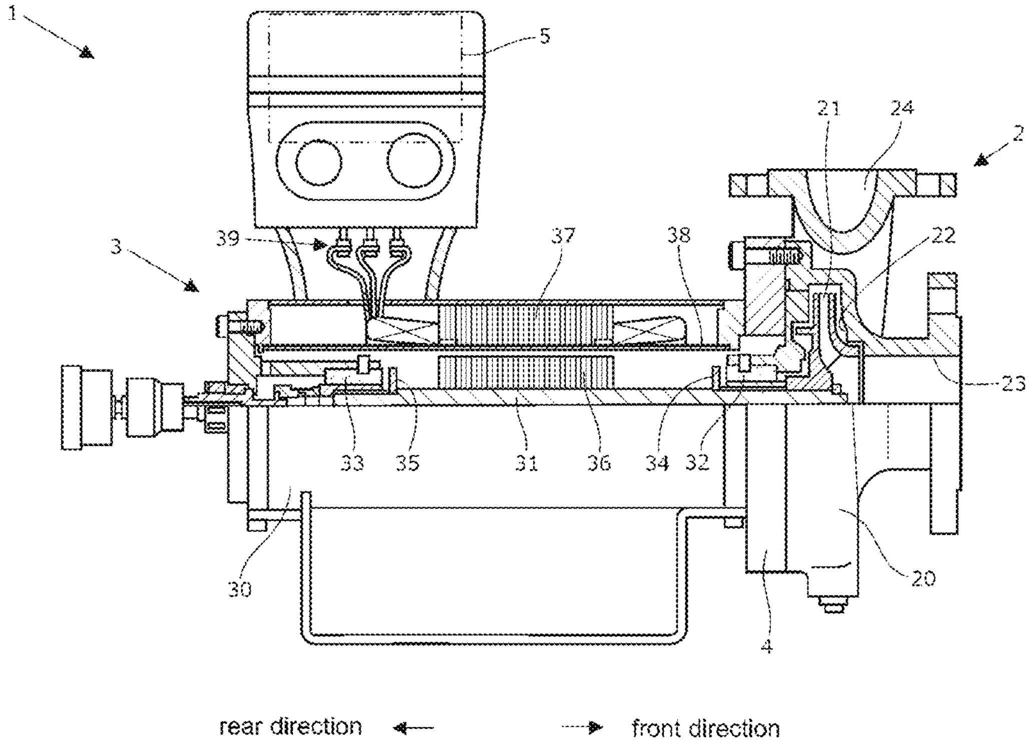
FIG. 1 is a side view of a canned motor pump.

The present invention enables a motor bearing wear monitoring device for a canned motor pump to include a function of calculating a ratio (a division value) between a signal voltage of a combined signal of detection coils at the front side and a signal voltage of a combined signal of detection coils at the rear side among the detection coils for detecting displacement of a rotor in a thrust direction, and a function of setting, based on the division value, an initial value indicating a position of the rotor in a state in which bearings are not worn, thereby easily setting the initial value regardless of a driving condition. Detail of each term will be described later.

Embodiments of a motor bearing wear monitoring device according to the present invention (hereinafter referred to as "present device"), a setting method for the motor bearing wear monitoring device (hereinafter referred to as "present method"), and a setting program (hereinafter referred to as "present program") will be described below with reference to the drawings. In the drawings, the same members and components are indicated with the same reference signs, and repetitive description thereof will be omitted.

Canned Motor Pump

Configuration of Canned Motor Pump

First, the configuration of a canned motor pump will be described.

FIG. 1 is a side view of the canned motor pump. The figure illustrates an upper half portion of the canned motor pump 1 in section for convenience of description.

The canned motor pump 1 is a pump having a structure in which handling liquid does not leak and used in particular for feeding high-temperature liquid or highly dangerous liquid (e.g., a liquid that is explosive, flammable, or toxic). The pump 1 includes a pump unit 2, a motor unit 3, an adapter 4, and the present device 5.

In the configurations of the canned motor pump 1, the configurations of the pump unit 2, the motor unit 3, and the adapter 4 are common to the configurations of a known canned motor pump. Thus, in the following description, the configurations of the pump unit 2, the motor unit 3, and the adapter 4 will be briefly described, and the detailed description thereof will be omitted.

In the following description, the "front direction" is a direction (forward) in which the pump unit 2 is positioned with respect to the motor unit 3, and the "rear direction" is a direction (backward) in which the motor unit 3 is positioned with respect to the pump unit 2.

The pump unit 2 sucks and discharges the handling liquid. The pump unit 2 includes a housing 20, an impeller 21, a pump chamber 22, a suction pipe portion 23, and a discharge pipe portion 24. The housing 20 includes the pump chamber 22 that accommodates the impeller 21, the suction pipe portion 23 that is a path for the handling liquid to be sucked into the pump chamber 22, and the discharge pipe portion 24 that is a path for the handling liquid to be discharged from the pump chamber 22. The pump chamber 22 communicates with the suction pipe portion 23 and the discharge pipe portion 24.

The motor unit 3 is driven under a predetermined driving condition (e.g., driving voltage is 200 V and driving frequency is 60 Hz) and rotates the impeller 21 of the pump unit 2. The motor unit 3 includes a housing 30, a rotating shaft 31, two bearings 32 and 33, two thrust washers 34 and 35, a rotor 36, a stator 37, a can 38, and a terminal 39. The motor unit 3 is an example of the motor in the present invention.

Figure 2:
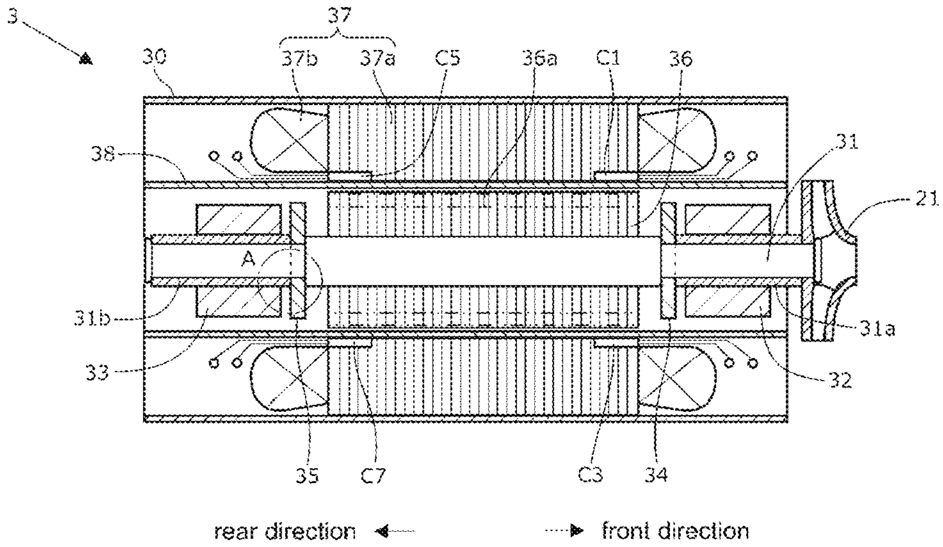
FIG. 2 is a schematic sectional view of a motor unit illustrating a longitudinal section of the motor unit included in the canned motor pump in FIG. 1.
Figure 3:
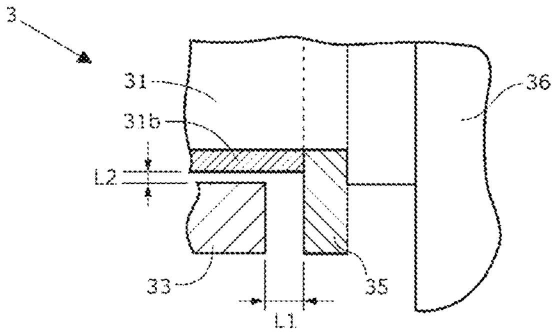
FIG. 3 schematically illustrates an enlarged sectional view of a part A of the motor unit in FIG. 2.

FIG. 2 is a schematic sectional view of the motor unit 3 illustrating a longitudinal section of the motor unit 3. FIG. 3 schematically illustrates an enlarged sectional view of a part A of the motor unit 3 in FIG. 2.

The housing 30 liquid-tightly accommodates the stator 37 and the can 38.

The rotating shaft 31 rotates by the rotation of the rotor 36 and transmits rotating power to the impeller 21. The rotating shaft 31 has a solid cylindrical shape. The rotating shaft 31 is disposed through the rotor 36 and is fixed. A front end portion of the rotating shaft 31 projects into the pump chamber 22 (see FIG. 1), and the impeller 21 is attached to the front end portion. The rotating shaft 31 includes hollow cylindrical-shaped sleeves 31*a* and 31*b* that protect a front portion and a rear portion of the rotating shaft 31.

In the following description, the "thrust direction" is an axial direction of the rotating shaft 31, the "radial direction" is a radial direction of the rotating shaft 31, and the "circumferential direction" is a circumferential direction of the rotating shaft 31.

The bearing 32 is disposed at the front direction of the rotor 36 and rotatably supports the rotating shaft 31. The bearing 33 is disposed at the rear direction of the rotor 36 and rotatably supports the rotating shaft 31. The bearings 32 and 33 are rolling bearings, for example. The thrust washer 34 is attached between the bearing 32 and the rotor 36 on the rotating shaft 31 and restricts the movement of the rotating shaft 31 in the front direction. The thrust washer 35 is attached between the bearing 33 and the rotor 36 on the rotating shaft 31 and restricts the movement of the rotating shaft 31 in the rear direction.

A gap of the length L1 is each defined between the bearing 32 and the thrust washer 34 and between the bearing 33 and the thrust washer 35. A gap of the length L2 is each defined between the bearing 32 and the sleeve 31*a* and between the bearing 33 and the sleeve 31*b*.

The rotor 36 rotates due to a rotating magnetic field generated in the stator 37. The rotor 36 has a hollow cylindrical shape. The rotor 36 includes a plurality of rod-shaped rotor bars 36*a*, the number thereof being 28 in the present embodiment, that are embedded at equal intervals in an outer peripheral edge portion of the rotor 36 in the circumferential direction. In a state where the bearings 32 and 33 are not worn (unworn state), the rotor 36 is disposed at an initial position with respect to the stator 37. In the present embodiment, the "initial position" is a position where the center of the stator 37 and the center of the rotor 36 coincide with each other in the thrust direction and the radial direction.

The stator 37 generates the rotating magnetic field that rotates the rotor 36. The stator 37 has a substantially hollow cylindrical shape. The stator 37 includes a stator core 37*a* and a plurality of motor windings 37*b*.

The stator core 37*a* holds the motor winding 37*b*. The stator core 37*a* has a hollow cylindrical shape. The stator core 37*a* includes a plurality of tooth portions 37*c* (see FIG. 6, the same applies hereinafter).

The tooth portions 37*c* define slots 37*d* (see FIG. 6, the same applies hereinafter) through which the motor windings 37*b* are disposed. In the circumferential direction, the tooth portions 37*c* are disposed at equal intervals on an inner peripheral surface of the stator core 37*a*. The motor windings 37*b* are disposed through the slots 37*d* and are connected to a power supply device (not illustrated) such as an inverter, for example, via the terminal 39.

The can 38 liquid-tightly accommodates the rotating shaft 31, the bearings 32 and 33, the thrust washers 34 and 35, and the rotor 36. The can 38 has a hollow cylindrical shape. Some handling liquid introduced from the suction pipe portion 23 is introduced into the can 38, used for cooling the bearings 32 and 33 and the motor unit 3, and discharged to the discharge pipe portion 24.

Referring now back to FIG. 1, the adapter 4 is connected to an end portion of the pump unit 2 on the rear side and an end portion of the motor unit 3 on the front side, and the adapter 4 interconnects the pump unit 2 and the motor unit 3.

The present device 5 detects a change in magnetic flux corresponding to a mechanical position change of the rotor 36 with respect to the stator 37, thereby monitoring a wear state of the bearings 32 and 33 supporting the rotating shaft 31. A specific configuration of the present device 5 will be described later.

Motor Bearing Wear Monitoring Device (1)

Configuration of Motor Bearing Wear Monitoring Device (1)

Next, the configuration of the present device 5 will be described. In the following description, FIGS. 1 to 3 will be referred to as appropriate.

Figure 4:
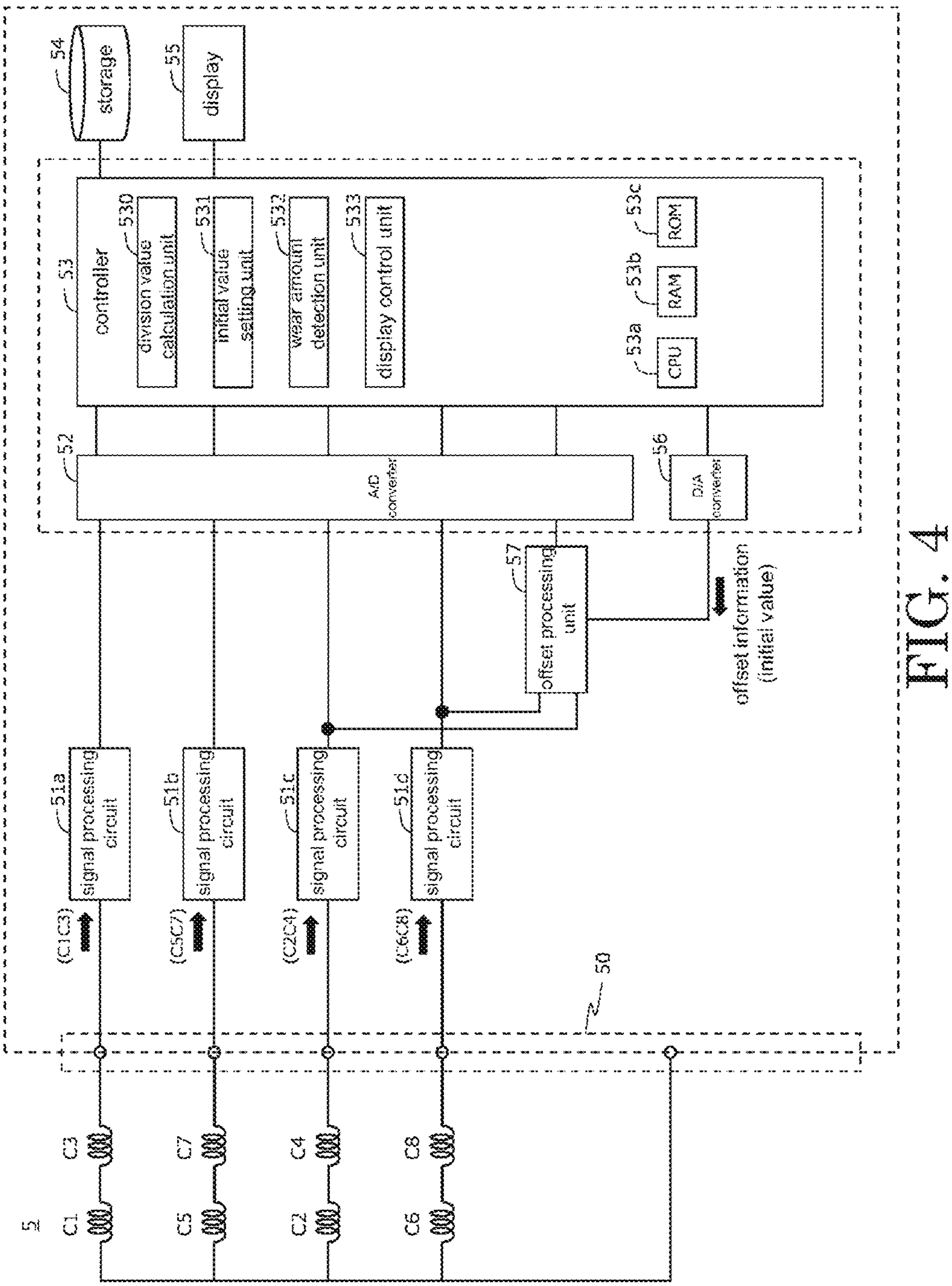
FIG. 4 is a functional block diagram illustrating an embodiment of the motor bearing wear monitoring device according to the present invention.

FIG. 4 is a functional block diagram illustrating an embodiment of the present device 5.

The present device 5 includes eight detection coils C1, C2, C3, C4, C5, C6, C7, and C8, a connection 50, signal processing circuits 51*a*, 51*b*, 51*c*, and 51*d*, an A/D converter 52, a controller 53, a storage 54, a display 55, a D/A converter 56, and an offset processing unit 57. The A/D converter 52, the controller 53, and the D/A converter 56 are implemented by a microcomputer, for example.

Figure 5:
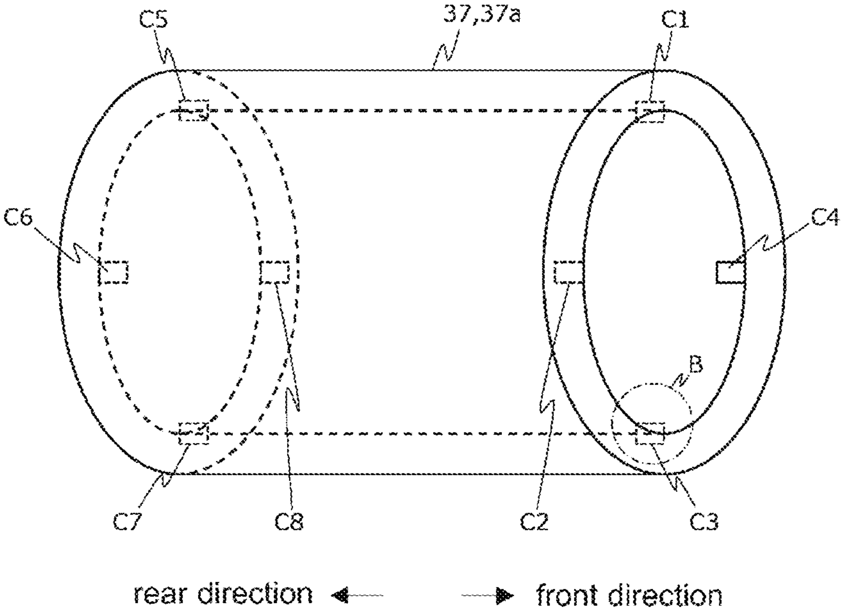
FIG. 5 is a schematic perspective view of a stator core illustrating arrangement of detection coils included in the motor bearing wear monitoring device in FIG. 4.
Figure 6:
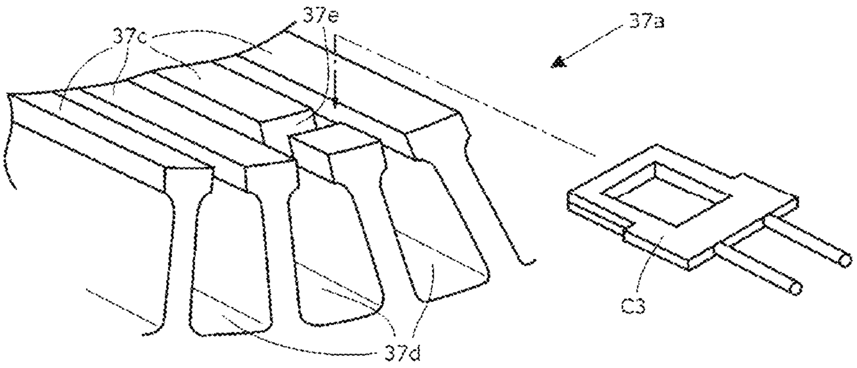
FIG. 6 is an enlarged perspective view of a part B in FIG. 5.

FIG. 5 is a schematic perspective view of a stator core 37*a* illustrating the arrangement of the detection coils C1 to C8. FIG. 6 is an enlarged perspective view of a part B in FIG. 5.

Each of the detection coils C1 to C8 detects a change in magnetic flux corresponding to a position change (displacement) of the rotor 36 with respect to the stator 37 and generates and outputs detection signals indicating the change in the magnetic flux. The rotor 36 is displaced in the radial direction together with the rotating shaft 31 depending on an amount of wear of the bearings 32 and 33 in the radial direction, and the rotor 36 is displaced in the thrust direction together with the rotating shaft 31 depending on an amount of wear of the bearings 32 and 33 in the thrust direction. That is, the amount of displacement of the rotor 36 can be regarded as the amount of wear of the bearings 32 and 33. Thus, the present device 5 is able to detect the amount of wear of the bearings 32 and 33 by detecting the amount of displacement of the rotor 36 by using the detection coils C1 to C8. Each of the detection coils C1 to C8 has a flat bobbin shape. The detection coils C1 to C8 are fitted into notches 37*e* formed in tooth portions 37*c* at end portions on the front side and the rear side of the stator 37.

In the circumferential direction, the detection coils C1 to C4 are attached at equal intervals (at intervals of 90 degrees) to a front end portion of the tooth portions 37*c* of the stator 37. The detection coil C1 is disposed at a position of 180 degrees with respect to the detection coil C3 so as to face the detection coil C3, and the detection coil C2 is disposed at a position of 180 degrees with respect to the detection coil C4 so as to face the detection coil C4. In contrast, in the circumferential direction, the detection coils C5 to C8 are attached at equal intervals (at intervals of 90 degrees) to a rear end portion of the tooth portions 37*c* of the stator 37. The detection coil C5 is disposed at a position of 180 degrees with respect to the detection coil C7 so as to face the detection coil C7, and the detection coil C6 is disposed at a position of 180 degrees with respect to the detection coil C8 so as to face the detection coil C8.

Figure 7:
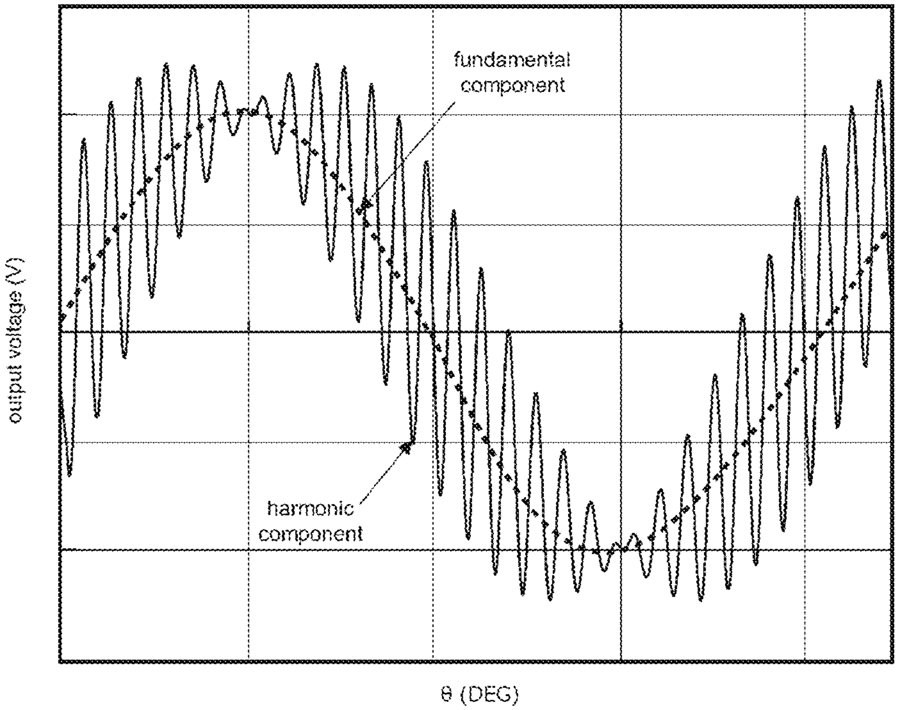
FIG. 7 is a schematic diagram illustrating an example of a detection signal of the detection coil in FIG. 5.

FIG. 7 is a schematic diagram illustrating an example of the detection signal.

In the figure, the horizontal axis indicates a rotation angle of the rotor 36, and the vertical axis indicates a signal voltage (a signal level) of induced electromotive force of the detection coils C1 to C8. The detection signals of the detection coils C1 to C8 include a waveform corresponding to a change in main magnetic flux of the motor unit 3 (hereinafter referred to as "fundamental component") and a waveform corresponding to a change in magnetic flux generated by an induced current flowing through the rotor bars 36*a* of the rotor 36 (hereinafter referred to as "harmonic component"). The fundamental component is generated by a driving voltage of the motor unit 3, and the frequency thereof is the same as a driving frequency of the driving voltage. The harmonic component is generated by the induced current flowing through the rotor bars 36*a*, and the frequency thereof is determined by the rotation of the rotor 36 and the number of the rotor bars 36*a*. That is, for example, under the following condition: the driving frequency is 60 Hz, and the number of rotor bars 36*a* is 28, each of the detection coils C1 to C8 detects 28 times a change in the magnetic flux due to the rotor bar 36*a* while the rotor 36 rotates once. Thus, the frequency of the harmonic component is 60 Hz×28=1.68 kHz. In this way, the fundamental component is determined based on the driving frequency, and the harmonic component is determined based on the rotation of the rotor 36, the driving frequency, and the number of the rotor bars 36*a*.

The detection coils C1, C3, C5, and C7 detect the change in the magnetic flux corresponding to the displacement of the rotor 36 in the radial direction due to the increase in the gap (L2) between the bearing 32 and the sleeve 31*a* and between the bearing 33 and the sleeve 31*b*, thereby detecting the displacement of the rotor 36 in the radial direction (i.e., the amount of wear of the bearings 32 and 33 in the radial direction). The detection coils C1 and C3 constitute one pair of radial detection coils and are connected so that the detection signals thereof cancel each other out (i.e., in such a way that a difference is obtained). The detection coils C5 and C7 constitute another pair of radial detection coils and are connected so that the detection signals thereof cancel each other out.

When the front side of the rotor 36 is displaced from the initial position in the radial direction due to the wear of the bearing 32, the signal level of the harmonic component increases on the side where the rotor 36 approaches (e.g., at the detection coil C1) and decreases on the side from which the rotor 36 moves farther away (e.g., at the detection coil C3), among the pair of detection coils C1 and C3. Thus, when the detection signals of the detection coils C1 and C3 are combined in such a way as to obtain the difference therebetween, the difference in a signal voltage (a signal level) of the harmonic component increases depending on the displacement amount in the combined signal (hereinafter referred to as "combined signal C1C3"). Due to this difference, the amount of displacement of the rotor 36 in the radial direction on the front side is detected. That is, the difference indicates the amount of wear of the bearing 32 in the radial direction, and the value of the difference is represented by a voltage value. Similarly, in a combined signal of the detection signals of the detection coils C5 and C7 (hereinafter referred to as "combined signal C5C7"), the difference in the signal voltage of the harmonic component increases depending on the displacement amount. Due to the difference, the amount of displacement of the rotor 36 in the radial direction on the rear side is detected. That is, the difference indicates the amount of wear of the bearing 33 in the radial direction, and the value of the difference is represented by the voltage value. Accordingly, for example, when there is no displacement of the rotor 36 in the radial direction, the fundamental component and the harmonic component cancel each other out in each combined signal (C1C3, C5C7), and the voltage value thereof is approximately "0". In contrast, when there is displacement of the rotor 36 in the radial direction, the difference value (the signal voltage value) between the harmonic components increases depending on the amount of displacement in each combined signal (C1C3, C5C7). Since the detection coils C1 and C3 are independent of the detection coils C5 and C7, the uneven wear of the bearings 32 and 33 (a state where one bearing is more worn than the other bearing) is detectable by comparing the value of the combined signal C1C3 with the value of the combined signal C5C7.

The detection coils C2, C4, C6, and C8 detect the amount of displacement of the rotor 36 in the thrust direction, i.e., the amount of wear of the bearings 32 and 33 in the thrust direction, by detecting the change in the magnetic flux corresponding to the displacement of the rotor 36 in the thrust direction due to an increase in the gap (L1) between the bearing 32 and the thrust washer 34 and between the bearing 33 and the thrust washer 35. The detection coils C2 and C4 constitute a pair of thrust detection coils and are connected so that detection signals thereof are superimposed on each other. Thus, the detection signals from the detection coils C2 and C4 are combined so as to be superimposed, and a combined signal C2C4 is generated. The detection coils C6 and C8 constitute another pair of thrust detection coils and are connected so that the detection signals thereof are superimposed on each other. Thus, the detection signals from the detection coils C6 and C8 are combined so as to be superimposed, and a combined signal C6C8 is generated.

Figure 8:
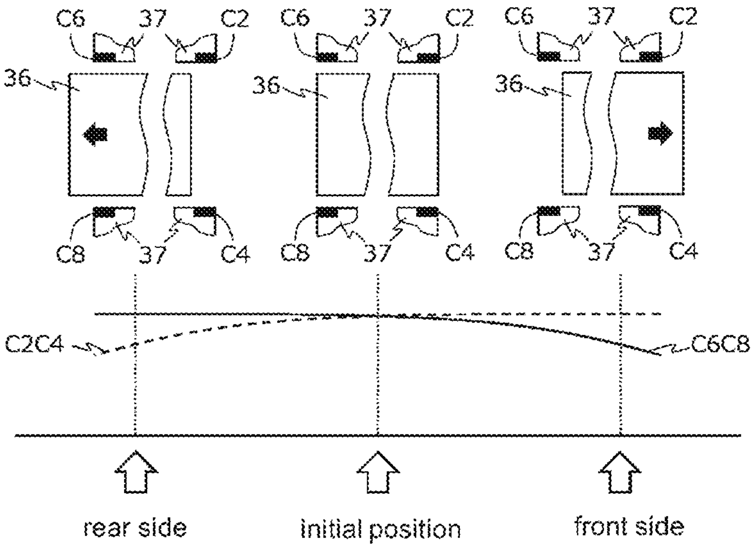
FIG. 8 is a schematic diagram illustrating a relation between a position of a rotor in a thrust direction with respect to a stator included in the motor unit in FIG. 2 and a combined signal obtained by combining two detection signals.

FIG. 8 is a schematic diagram illustrating a relation between a position of the rotor 36 with respect to the stator 37 in the thrust direction and each combined signal (C2C4, C6C8). In the figure, the vertical axis indicates the signal voltage (the signal level), and the horizontal axis indicates the position of the rotor 36 in the thrust direction.

When the rotor 36 is displaced from the initial position to the rear side, an overlap between the detection coils C2 and C4 and the rotor 36 (the amount of overlap described later) decreases in the radial direction, but an overlap between the detection coils C6 and C8 and the rotor 36 does not change. As a result, the signal level of the fundamental component of the combined signal C2C4 decreases, but the signal voltage (the signal level) of the fundamental component of the combined signal C6C8 hardly changes. Similarly, when the rotor 36 is displaced from the initial position to the front side, the signal voltage of the fundamental component of the combined signal C6C8 decreases, but the signal voltage of the fundamental component of the combined signal C2C4 hardly changes. Thus, the amount of displacement of the rotor 36 in the thrust direction can be detected by the difference between the combined signal C2C4 and the combined signal C6C8. That is, the difference indicates the amount of the displacement of the rotor 36 in the thrust direction, i.e., the amount of wear of the bearings 32 and 33 in the thrust direction, and the value of the difference is represented by a voltage value. Accordingly, for example, when there is no displacement of the rotor 36 in the thrust direction, the fundamental component and the harmonic component cancel each other out in the signal indicating the difference, and the voltage value thereof is approximately "0". In contrast, when there is displacement of the rotor 36 in the thrust direction, the difference value (the voltage value) of the fundamental component increases depending on the amount of the displacement in the signal indicating the difference. Herein, when the signal voltage decreases, the detection coils C2, C4, C6, and C8 are influenced by the magnetic flux-density distribution from the end portions of the rotor 36, and thus the signal voltage does not change linearly with respect to the displacement of the rotor 36 but changes in a slightly upwardly convex curve shape with respect to the position of the rotor 36. The combined signal C2C4 is an example of a first combined signal in the present invention, and the combined signal C6C8 is an example of a second combined signal in the present invention.

Referring now back to FIG. 4, the connection 50 is an interface to which the detection coils C1 to C8 are connected.

The signal processing circuits 51*a* to 51*d* include a filter circuit, a rectifier circuit, and an integrating circuit, for example. The signal processing circuits 51*a* to 51*d* execute predetermined signal processing (filtering processing, rectifying, and AC-DC conversion) for the combined signals C1C3, C5C7, C2C4, and C6C8 respectively, and convert the combined signals C1C3, C5C7, C2C4, and C6C8 from alternating current to direct current. The signal processing circuit 51*a* is connected to the detection coils C1 and C3, and the signal processing circuit 51*b* is connected to the detection coils C5 and C7, the signal processing circuit 51*c* is connected to the detection coils C2 and C4, and the signal processing circuit 51*d* is connected to the detection coils C6 and C8.

The A/D converter 52 is connected to the signal processing circuits 51*a* to 51*d* and the offset processing unit 57, converts an analog signal input from each of the circuits into a digital signal, and outputs the digital signal to the controller 53. The A/D converter 52 is an analog-digital converter having a 12-bit resolution, for example.

The controller 53 controls the operation of the whole present device 5. The controller 53 includes, for example, a processor such as a central processing unit (CPU) 53*a*, a volatile memory such as a random access memory (RAM) 53*b* that functions as a working area for the CPU 53*a*, and a non-volatile memory such as a read only memory (ROM) 53*c* that stores various kinds of information such as the present program and other control programs. The controller 53 includes a division value calculation unit 530, an initial value setting unit 531, a wear amount detection unit 532, and a display control unit 533.

In the controller 53, the present program operates, and the present program cooperates with the hardware resources of the present device 5 and achieves the present method described later. The processor (the CPU 53*a*) included in the controller 53 is allowed to execute the present program, and thus the present program enables the processor to function as the division value calculation unit 530, the initial value setting unit 531, the wear amount detection unit 532, and the display control unit 533 and enables the processor to execute the present method. The present program may be stored in a non-transitory storage medium, e.g., a compact disc (CD), a digital versatile disc (DVD), a universal serial bus (USB) memory, etc., in an installable file format or an executable file format and provided to the present device 5 via a dedicated reading medium.

The division value calculation unit 530 calculates a division value, that is, a ratio between the combined signal C2C4 and the combined signal C6C8 by dividing the signal voltage of the combined signal C2C4 from the pair of detection signals C2 and C4 by the signal voltage of the combined signal C6C8 from another pair of detection coils C6 and C8 among the plurality of detection coils C1 to C8. A specific operation of the division value calculation unit 530 and the division value will be described later.

The "division value" is information indicating only the displacement information of the rotor 36 in the thrust direction that does not include the influence of the driving condition (driving frequency, driving voltage, driving current, etc.,) as described later.

Herein, the displacement "f (x)" of the rotor 36 in the thrust direction is proportional to the time rate of change in the magnetic flux passing through the detection coils C2, C4, C6, and C8 and can be represented by the following expression (1), for example.

$$f(x) \propto d\varphi/dt \propto \text{magnetic circuit shape (magnetic flux density distribution)} \times \text{overlap amount} \quad \text{Expression (1)}$$

In the expression (1), "dφ/dt" is a change amount of the magnetic flux density in the detection coil, and the magnetic flux "φ" is proportional to the magnetic flux density distribution and the overlap amount. The "magnetic circuit" is a magnetic circuit unique to each motor unit 3, which is determined by the shapes of the rotor 36 and the stator 37, the position of the rotor 36 with respect to the stator 37, and the like.

As described above, when the rotor 36 is displaced in the thrust direction, the fundamental component of each combined signal (C2C4, C6C8) increases and decreases, but the harmonic component does not increase and decrease. The combined signal C2C4 and the combined signal C6C8 are in phase with each other. Thus, when the division value (the ratio) is calculated between the two combined signals C2C4 and C6C8, the harmonic components disappear, and the division value indicates the ratio of the signal voltages of the fundamental components indicating the displacement of the rotor 36 in the thrust direction. Herein, the ratio of the signal voltages of the fundamental components can be represented by the following expression (2), for example.

$$f1(i\omega, x)/f2(i\omega, x) \approx i\omega \times f1(x)/i\omega \times f2(x) = f1(x)/f2(x) \quad \text{Expression (2)}$$

In the expression (2), "f1(*x*)" is the displacement on the front side, "f2(*x*)" is the displacement on the rear side, "i" is a current flowing through the detection coils C2, C4, C6, and C8, and "ω" is an angular speed. In a range where the magnetic characteristics of the magnetic circuit change linearly, the term "iω" is proportional to the time rate of change in the magnetic flux passing through the detection coils C2, C4, C6, and C8, and the relation represented by the following expression (3) is established.

$$i\omega \propto d\varphi/dt \quad \text{Expression (3)}$$

As indicated in the expression (3), the term "iω" is proportional to the time rate of change in the magnetic flux, and the magnetic flux varies depending on the driving condition. Accordingly, the term "iω" varies depending on the driving condition. Then, as indicated in the expression (2), the division value between the two combined signals C2C4 and C6C8 is calculated, and thus the term "iω" that varies depending on the driving condition disappears, only the information indicating the displacement is retained in the division value, and this information is extracted.

Figure 9:
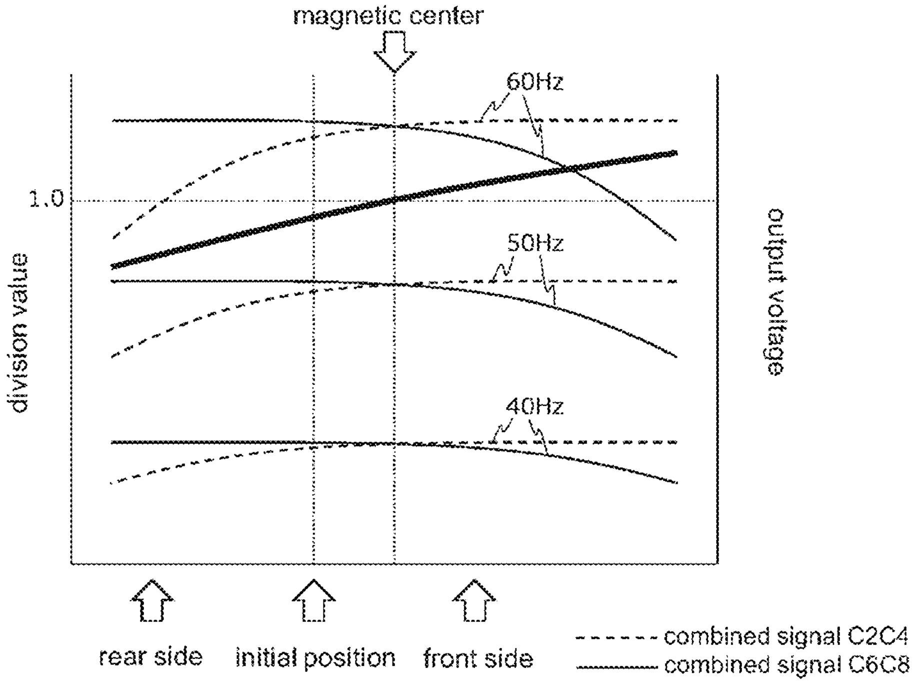
FIG. 9 is a schematic diagram illustrating a correspondence between a position of the rotor in the thrust direction with respect to the stator included in the motor unit of FIG. 2 and a division value.

FIG. 9 is a schematic diagram illustrating a correspondence between a position of the rotor 36 in the thrust direction and the division value. For convenience of description, the figure also illustrates the voltage value (the difference value) of each combined signal (C2C4, C6C8) under three driving conditions (driving frequencies: 40 Hz, 50 Hz, and 60 Hz). In the figure, the vertical axis indicates the division value and the voltage value, and the horizontal axis indicates the position of the rotor 36 in the thrust direction.

As illustrated in FIG. 9, the division value varies depending on the position of the rotor 36, and the variation pattern exhibits a substantially linear characteristic due to the magnetic circuit. Then, the division value is "1" at a point where the signal voltage value of the combined signal C2C4 and the signal voltage value of the combined signal C6C8 coincide with each other (hereinafter referred to as "magnetic center"). The variation patterns of the division values are identical under the three driving conditions. That is, the division value may function as an indicator indicating the position of the rotor 36 in the thrust direction with respect to the magnetic center, regardless of the driving condition. Accordingly, the present device 5 is able to estimate a current position of the rotor 36 with respect to the magnetic center by obtaining the division value under any of the driving conditions. In other words, the present device 5 is able to estimate, based on the division value, the current position of the rotor 36 in the thrust direction with respect to the magnetic center and the current position of the magnetic center with respect to the position of the rotor 36.

Note that, in the present invention, the division value calculation unit 530 may calculate the division value by dividing the signal voltage of the combined signal C6C8 of the detection coils C6 and C8 by the signal voltage of the combined signal C2C4 of the detection coils C2 and C4. In this case, the variation pattern obtained from a first correspondence information described later has a shape in which the front side and the rear side are reversed with respect to the variation pattern illustrated in FIG. 9 with the magnetic center as the center.

The initial value setting unit 531 sets an initial value, based on the division value at the initial position. A specific operation of the initial value setting unit 531 will be described later.

The "initial value" is a parameter to be set in the present device 5 in order to display the position (the initial position) of the rotor 36 in the thrust direction in the non-worn state on the display 55 as the position of the amount of wear "0" of the bearings 32 and 33. The initial value is represented by the difference value between the combined signal C2C4 and the combined signal C6C8 in the non-worn state and indicates the position of the rotor 36 in the thrust direction in the non-worn state.

The wear amount detection unit 532 detects the amount of displacement of the rotor 36 in the radial direction on the front and rear sides, based on the differences between each detection signal output from the pair of detection signals C1 and C3 and the another pair of detection signals C5 and C7, i.e., based on each combined signal (C1C3, C5C7), thereby detecting the amount of wear of the bearings 32 and 33 in the radial direction. The wear amount detection unit 532 detects the amount of displacement of the rotor 36 in the thrust direction, based on the difference value between the combined signal C2C4 and the combined signal C6C8, thereby detecting the amount of wear of the bearings 32 and 33 in the thrust direction. A specific operation of the wear amount detection unit 532 will be described later.

The display control unit 533 controls display of the amount of wear on the display 55, based on display information described later and the amount of wear detected by the wear amount detection unit 532.

The storage 54 stores information (e.g., the first correspondence information, reference adjustment data, etc.,) necessary for the operation of the present device 5. The storage 54 is a non-volatile memory such as an electrically erasable programmable read-only memory (EEPROM) or a flash memory, for example.

The "first correspondence information" is information indicating the correspondence between the division value and the position of the rotor 36 in the thrust direction with respect to the magnetic center, that is, the information indicating the above-described variation pattern. The first correspondence information indicates a change in the magnetic flux densities detected by the detection coils C2, C4, C6, and C8 that detect the displacement in the thrust direction and is unique information that is determined for each model of the canned motor pump 1, i.e., for each magnetic-circuit shape such as the shapes and sizes of the rotor 36 and the stator 37. In the present embodiment, the first correspondence information is stored in the storage 54 as a table.

Figure 10:
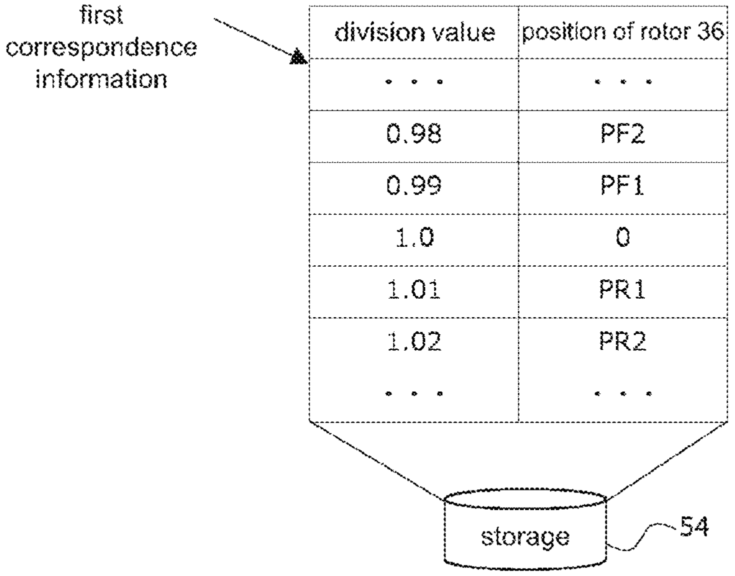
FIG. 10 is a schematic diagram illustrating an example of information stored in a storage included in the motor bearing wear monitoring device in FIG. 4.

FIG. 10 is a schematic diagram illustrating an example of the information (the first correspondence information) stored in the storage 54. The figure indicates that, when the division value is "1", the rotor 36 is located at "0" indicating the magnetic center. The figure also indicates that the position of the rotor 36 is determined for each division value.

Note that, in the present invention, the storage 54 may store a function as the first correspondence information instead of the table.

Referring now back to FIG. 4, the "reference adjustment data" is information composed of a group of parameters serving as a reference for the present device 5 to accurately detect the amount of displacement of the rotor 36, i.e., the amount of wear of the bearings 32 and 33, based on the detection signals of the detection coils C1 to C8. The reference adjustment data includes second correspondence information, offset information, third correspondence information, and display information, and the like. The reference adjustment data is measured or set in advance under a predetermined reference driving condition prior to shipment of the canned motor pump 1 and stored in the storage 54, for example. The "reference driving condition" is a driving condition depending on an installation environment of the canned motor pump 1 (e.g., driving frequency is 60 Hz, driving voltage is 200V), for example.

The "second correspondence information" is information indicating the correspondence between the position (the displacement amount) of the rotor 36 in the thrust direction with respect to the stator 37 and the difference value (the voltage value) between the combined signal C2C4 and the combined signal C6C8 under the reference driving condition. The "position of the rotor 36 in the thrust direction in the second correspondence information" is an initial position (a machine center described later), a position where the rotor 36 is displaced from the initial position to the front side by the maximum distance (hereinafter referred to as "front position", and a position where the rotor 36 is displaced from the initial position to the rear side by the maximum distance (hereinafter referred to as "rear position"). The "maximum distance" is a distance between the initial position and the position of the rotor 36 when the bearings 32 and 33 are worn by the maximum displacement amount, for example. As described above, the amount of displacement of the rotor 36 in the thrust direction with respect to the stator 37 means the amount of wear of the bearings 32 and 33 in the thrust direction. That is, the second correspondence information indicates the correspondence between the amount of wear of the bearings 32 and 33 in the thrust direction and the difference value (the voltage value) under the reference driving condition. In the following description, the difference value at the initial position is referred to as a thrust center value, the difference value at the front position is referred to as a front value, and the difference value at the rear position is referred to as a rear value.

The "offset information" is information (e.g., a voltage value) indicating an offset voltage to be added to or subtracted from the combined signal C2C4 in first offset processing. The initial value is set in the offset information. That is, the offset information is an example of the initial value in the present invention.

The "first offset processing" means processing for adding or subtracting the offset voltage to or from the combined signal C2C4 in such a way that the difference value between the combined signal C2C4 and the combined signal C6C8 accurately indicates the amount of displacement of the rotor 36 in the thrust direction (the amount of wear of the bearings 32 and 33 in the thrust direction) under the reference driving condition.

A "third correspondence information" is information indicating a correspondence between the position (the amount of displacement) of the rotor 36 in the radial direction with respect to the stator 37 and the voltage value (the difference value) of each combined signal (C1C3, C5C7) under the reference driving condition. The "position of the rotor 36 in the radial direction in the third correspondence information" includes the initial position and a position of the rotor 36 when the bearings 32 and 33 are worn by the maximum displacement amount in the radial direction (hereinafter referred to as "radial position"). As described above, the amount of displacement of the rotor 36 in the radial direction with respect to the stator 37 means the amount of wear of the bearings 32 and 33 in the radial direction. That is, the third correspondence information indicates the correspondence between the amount of wear of the bearings 32 and 33 in the radial direction and the difference value (the voltage value) under the reference driving condition. In the following description, the difference value at the initial position is referred to as a radial center value, and the difference value at the radial position is referred to as a radial value.

The "display information" is information indicating a relation between the amount of displacement of the rotor 36 with respect to the stator 37 (the amount of wear of the bearings 32 and 33) and a display mode of light emitting diodes (LEDs) in the display 55. In the display information, the amount of displacement (the amount of wear) is represented by a ratio to the maximum amount of displacement (the maximum amount of wear).

Note that, in the present invention, the storage 54 may store, as one piece of information, a correspondence between the division value, the position of the rotor 36 in the thrust direction with respect to the magnetic center, and the difference value (the voltage value) between the combined signal C2C4 and the combined signal C6C8.

Figure 11:
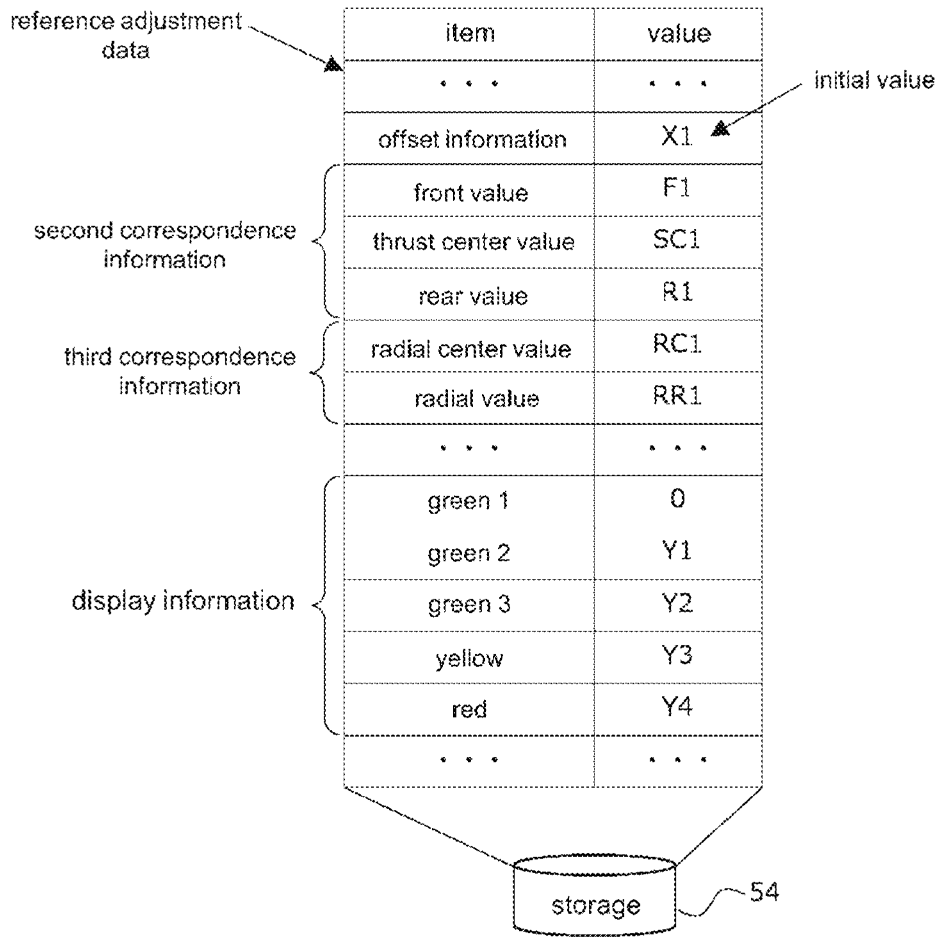
FIG. 11 is a schematic diagram illustrating another example of information stored in the storage included in the motor bearing wear monitoring device in FIG. 4.

FIG. 11 is a schematic diagram illustrating an example of the information, i.e., the reference adjustment data, stored in the storage 54. The figure exemplarily illustrates a part of the reference adjustment data. The figure illustrates that the second correspondence information, the offset information, the third correspondence information, and the display information are stored in the storage 54 in association with one another as the reference adjustment data, for example.

The figure indicates that the voltage value (the initial value) of the offset information is "X1", the front value is "F1", the thrust center value is "SC1", the rear value is "R1", the radial center value is "RC1", and the radial value is "RR1", for example.

Figure 12:
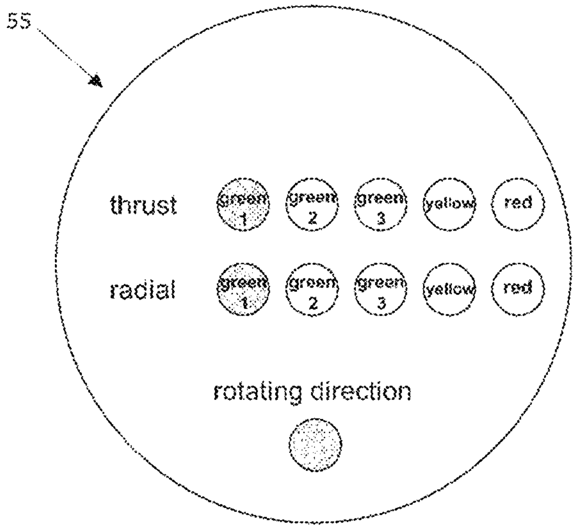
FIG. 12 is a schematic diagram illustrating an appearance of a display included in the motor bearing wear monitoring device in FIG. 4.

FIG. 12 is a schematic diagram illustrating an appearance of the display 55.

The display 55 displays the amount of wear of the bearings 32 and 33 and the rotating direction. The display 55 includes a plurality of light emitting diodes (LED) that displays the amount of wear in the radial direction and the thrust direction, and the rotating direction, for example. The display 55 displays the amount of wear in the radial direction and the thrust direction in five stages of "green 1", "green 2", "green 3", "yellow", and "red" and displays the rotating direction in lighting-on (normal rotation) and lighting-off (reverse rotation).

Figure 13:
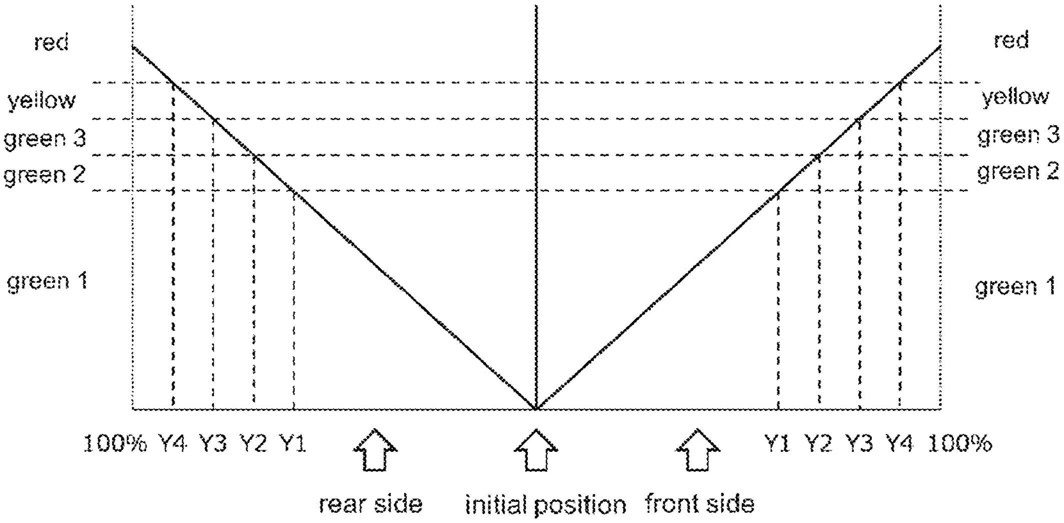
FIG. 13 is a schematic diagram illustrating a display mode in the thrust direction of the display in FIG. 12.

FIG. 13 is a schematic diagram illustrating a display mode of the display 55 in the thrust direction. In the figure, the vertical axis indicates the difference value (the voltage value), and the horizontal axis indicates the amount of displacement of the rotor 36 in the thrust direction (the amount of wear of the bearings 32 and 33 in the thrust direction). In the figure, a straight line is a line connecting the thrust center value to the front value and connecting the thrust center value to the rear value and indicates the second correspondence information. Since the difference value between the combined signals C2C4 and C6C8 is proportional to the amount of wear, the amount of wear can be uniquely specified based on the difference value, and the display mode of the display 55 can also be specified as illustrated in FIG. 13. When it is assumed that the maximum amount of displacement (the maximum amount of wear) of the bearings 32 and 33 is "100%", the display 55 turns on the first "green 1" when the amount of wear is "less than Y1%", turns on the second "green 2" when the amount of wear is "Y1% or more and less than Y2%", turns on the third "green 3" when the amount of wear is "Y2% or more and less than Y3%", turns on "yellow" when the amount of wear is "Y3% or more and less than Y4%", and turns on "red" when the amount of wear is "Y4% or more", for example.

Referring now back to FIG. 4, the D/A converter 56 converts the offset information (the initial value) to be input from the controller 53 from a digital signal to an analog signal.

The offset processing unit 57 executes the first offset processing, based on the offset information (the initial value) included in the reference adjustment data. The offset processing unit 57 includes an offset voltage generation circuit, an arithmetic circuit, and a difference absolute value conversion circuit, for example. The offset processing unit 57 generates an offset voltage, based on the offset information in the offset voltage generation circuit, and executes the first offset processing for the combined signal C2C4 by adding or subtracting the offset voltage to or from the combined signal C2C4 in the arithmetic circuit. The offset processing unit 57 calculates (generates) a difference value between the combined signal C2C4 after the first offset processing in the arithmetic circuit and the combined signal C6C8, and converts the difference value into an absolute value in the difference absolute value conversion circuit. The absolute value is input to the controller 53.

Operation of Canned Motor Pump (Motor Bearing Wear Monitoring Device (1))

Next, operations of the canned motor pump 1 will be described below with a focus on operations of the present device 5. In the following description, FIGS. 1 to 13 will be referred to as appropriate.

Figure 14:
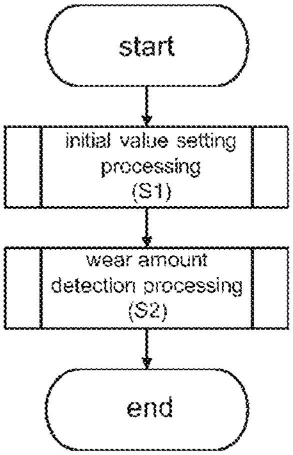
FIG. 14 is a flowchart illustrating an example of an operation of the motor bearing wear monitoring device in FIG. 4.

FIG. 14 is a flowchart illustrating an example of the operations of the present device 5.

The present device 5 executes initial value setting processing (S1) at a predetermined timing, and executes wear amount detection processing (S2) on a regular basis (e.g., every 1 sec) during the operation of the canned motor pump 1. The "predetermined timing" is a timing at which the initial value is to be set, such as a timing of a test operation before shipment of the canned motor pump 1, a timing of an initial operation at an installation site, or a timing of maintenance.

Initial Value Setting Processing

Figure 15:
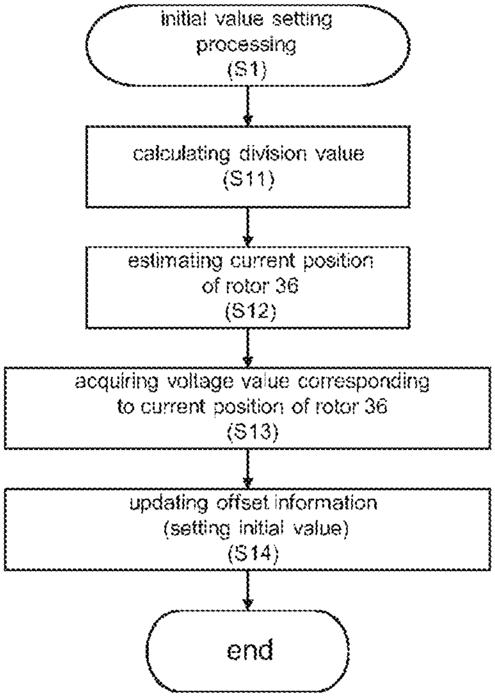
FIG. 15 is a flowchart illustrating an example of initial value setting processing included in the operation in FIG. 14.

FIG. 15 is a flowchart illustrating an example of the initial value setting processing (S1).

The "initial value setting processing (S1)" is processing in which the present device 5 acquires a division value at a predetermined timing and acquires and sets an initial value, based on the division value. In the present embodiment, the initial value setting processing (S1) is an example of the present method.

As a preliminary step of the initial value setting processing (S1), the canned motor pump 1 is supplied with a power source under a predetermined driving condition and the rotor 36 rotates. In this case, the bearings 32 and 33 are in the unworn state, and the rotor 36 is located at the initial position. The detection signals (each combined signal C2C4, C6C8) from the detection coils C2, C4, C6, and C8 that detect the displacement in the thrust direction are converted from alternating current to direct current in the signal processing circuits 51*a* to 51*d*, converted from analog signals to digital signals in the A/D converter 52, and input to the controller 53 (the division value calculation unit 530).

Note that, in the initial value setting processing (S1), the liquid fed by the canned motor pump 1 is not limited to actual handling liquid and may be water. The canned motor pump 1 does not need to feed liquid and the motor unit 3 may idle. The driving condition may be any condition that allows the canned motor pump 1 to operate normally and is not limited to the rated condition.

First, the division value calculation unit 530 calculates the division value by dividing the signal voltage of the combined signal C2C4 by the signal voltage of the combined signal C6C8 (S11: division value calculation step).

Then, the initial value setting unit 531 refers to the first correspondence information stored in the storage 54 by using the calculated division value and acquires (estimates) the current position of the rotor 36 in the thrust direction with respect to the magnetic center (S12).

Then, the initial value setting unit 531 refers to the second correspondence information stored in the storage 54 by using the acquired current position and acquires a voltage value corresponding to the current position of the rotor 36 (S13).

Then, the initial value setting unit 531 updates the offset information in the storage 54 with the acquired voltage value (S14: initial value setting step). As a result, the offset information (the initial value) is set to the acquired voltage value.

In this way, the present device 5 sets the initial value, based on the division value between the two combined signals C2C4 and C6C8. As a result, the present device 5 is able to accurately detect the wear amount corresponding to the reference driving condition by offsetting the voltage value of the combined signal C2C4 by using the initial value in such a way that the absolute value (the voltage value) of the difference value between the combined signal C2C4 and the combined signal C6C8 become "0" at the initial position.

Wear Amount Detection Processing

Figure 16:
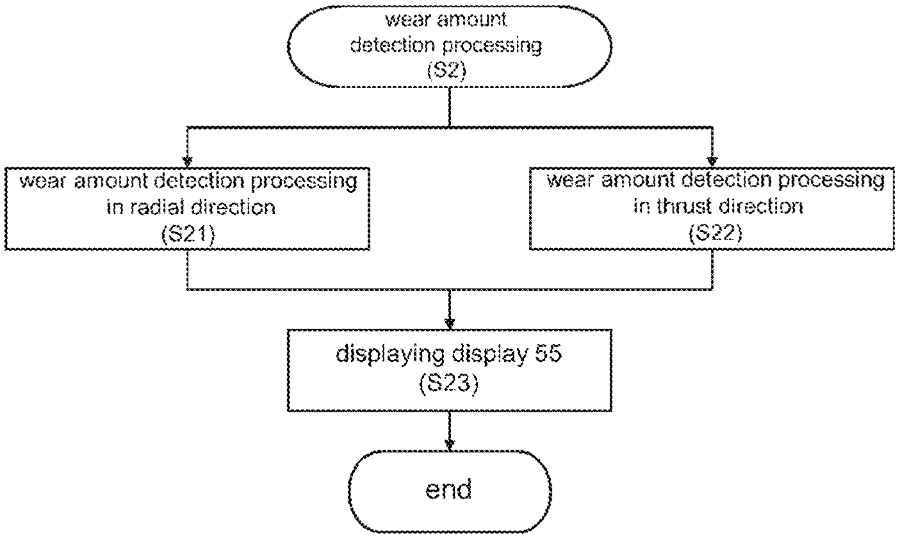
FIG. 16 is a flowchart illustrating an example of wear amount detection processing included in the operation in FIG. 14.

FIG. 16 is a flowchart illustrating an example of wear amount detection processing (S2).

The "wear amount detection processing (S2)" is processing for detecting the amount of wear of the bearings 32 and 33, based on the combined signals C1C3, C5C7, C2C4, and C6C8.

The detection coils C1 to C8 output the detection signals at all times when the rotor 36 rotates. The combined signals C1C3 and C5C7 from the detection coils C1, C3, C5, and C7 for detecting the displacement in the radial direction are converted from alternating current to direct current in the signal processing circuits 51*a* and 51*b*. Then, the combined signals C1C3 and C5C7 are converted from analog signals to digital signals in the A/D converter 52 and input to the controller 53 (the wear amount detection unit 532).

The detection signal (the combined signals C2C4 and C6C8) from the detection coils C2, C4, C6, and C8 that detect the displacement in the thrust direction are converted from alternating current to direct current in the signal processing circuits 51*c* and 51*d*. Then, the combined signals C2C4 and C6C8 are input to the offset processing unit 57. In the offset processing unit 57, the first offset processing is executed for the combined signal C2C4. The absolute value of the difference value between the combined signal C2C4 after the first offset processing and the combined signal C6C8 are calculated. The combined signal C2C4 after the first offset processing, the combined signal C6C8, and the absolute value are converted from the analog signals to the digital signals in the A/D converter 52 and input to the controller 53 (the wear amount detection unit 532).

In the wear amount detection processing (S2), the wear amount detection unit 532 individually executes wear amount detection processing in the radial direction (S21) and wear amount detection processing in the thrust direction (S22).

In the wear amount detection processing in the radial direction (S21), the wear amount detection unit 532 refers to the third correspondence information stored in the storage 54 by using the voltage value of the combined signal C1C3 and detects the wear amount of the bearing 32. Similarly, the wear amount detection unit 532 refers to the third correspondence information stored in the storage 54 by using the voltage value of the combined signal C5C7 and detects the wear amount of the bearing 33. Then, the wear amount detection unit 532 compares each amount of wear and selects the larger amount of wear as the amount of wear in the radial direction. The detected amount of wear is stored in the storage 54, for example, as log information.

In the wear amount detection processing in the radial direction (S22), the wear amount detection unit 532 refers to the second correspondence information stored in the storage 54 by using the absolute value of the difference value and detects the wear amount of the bearings 32 and 33 in the thrust direction. In this case, the wear amount detection unit 532 specifies whether the direction of wear is the front side or the rear side, based on a magnitude relation between the voltage value of the combined signal C2C4 after the first offset processing and the voltage value of the combined signal C6C8. The detected amount of wear is stored in the storage 54, for example, as log information.

Then, the display control unit 533 determines a display mode of the display 55, based on the detected amount of wear, and controls a display on the display 55 in such a way that the display on the display 55 is performed in the determined display mode (S23).

In this way, in the wear amount detection processing in the thrust direction (S22), the combined signal C2C4 after the first offset processing using the offset voltage based on the initial value is used. Thus, as described above, the wear amount detection unit 532 is able to detect the amount of wear in the thrust direction corresponding to a reference driving frequency.

Conclusion (1)

According to the embodiment described above, the present device 5 includes the plurality of detection coils C1 to C8, the division value calculation unit 530, and the initial value setting unit 531. The detection coils C1 to C8 include the detection coils C2, C4, C6, and C8 that detect the displacement of the rotor 36 in the thrust direction. The division value calculation unit 530 calculates the division value by dividing the signal voltage of the combined signal C2C4 from the pair of the detection coils C2 and C4 by the signal voltage of the combined signal C6C8 from another pair of the detection coils C6 and C8. The initial value setting unit 531 sets, when a position of the rotor 36 in the thrust direction in an unworn condition is set as the initial position, an initial value, based on the division value in the initial position. According to this configuration, the present device 5 sets the initial value corresponding to the initial position, based on the division value functioning as information indicating only the displacement without being affected by the driving condition. Thus, the present device 5 can estimate the current position of the rotor 36 in the thrust direction with respect to the magnetic center and the current position of the magnetic center with respect to the position of the rotor 36 and set the initial values, regardless of the driving condition. As a result, in the present device 5, the driving condition of the test operation for setting the initial value can be freely set (for example, idling may be used), work effort and time required for the test operation are reduced, and the setting of the initial value is facilitated.

According to the embodiment described above, the present device 5 includes the storage 54 that stores the first correspondence information. The initial value setting unit 531 sets the initial value, based on the division value and the first correspondence information. According to this configuration, the present device 5 can accurately estimate the current position of the rotor 36 in the thrust direction with respect to the magnetic center and the current position of the magnetic center with respect to the position of the rotor 36, regardless of the driving condition.

According to the embodiment described above, the storage 54 stores the second correspondence information. The initial value setting unit 531 sets the initial value, based on the division value, the first correspondence information, and the second correspondence information. According to this configuration, the present device 5 is able to estimate the current position of the rotor 36 in the thrust direction and set the initial value depending on the current position. As a result, the present device 5 can accurately detect the wear amount corresponding to the reference driving condition by offsetting the voltage value of the combined signal C2C4 by using the initial value in such a way that the absolute value (the voltage value) of the difference value between the combined signal C2C4 and the combined signal C6C8 become "0" at the initial position.

According to the embodiment described above, the present device 5 includes the wear amount detection unit 532 that detects the wear amount of the bearings 32 and 33 in the thrust direction, based on the difference value between the combined signal C2C4 and the combined signal C6C8 and the second correspondence information. According to this configuration, the present device 5 is able to detect the accurate wear amount under the reference driving condition corresponding to the second correspondence information.

Note that, in the present invention, the expressions (1) to (3) used in the description of the division value are examples, and the division value may be described by expressions represented in different aspects.

Motor Bearing Wear Monitoring Device (2)

Next, another embodiment (hereinafter referred to as "second embodiment") of the motor bearing wear monitoring device according to the present invention will be described with a focus on differences from the previously described embodiment (hereinafter referred to as "first embodiment"). In the second embodiment, the signal processing for the combined signal to be used for calculating the division value is different from that in the first embodiment. In the following description, components in common with the first embodiment are indicated with the same reference signs, and the description thereof will be omitted.

Configuration of Motor Bearing Wear Monitoring Device (2)

Figure 17:
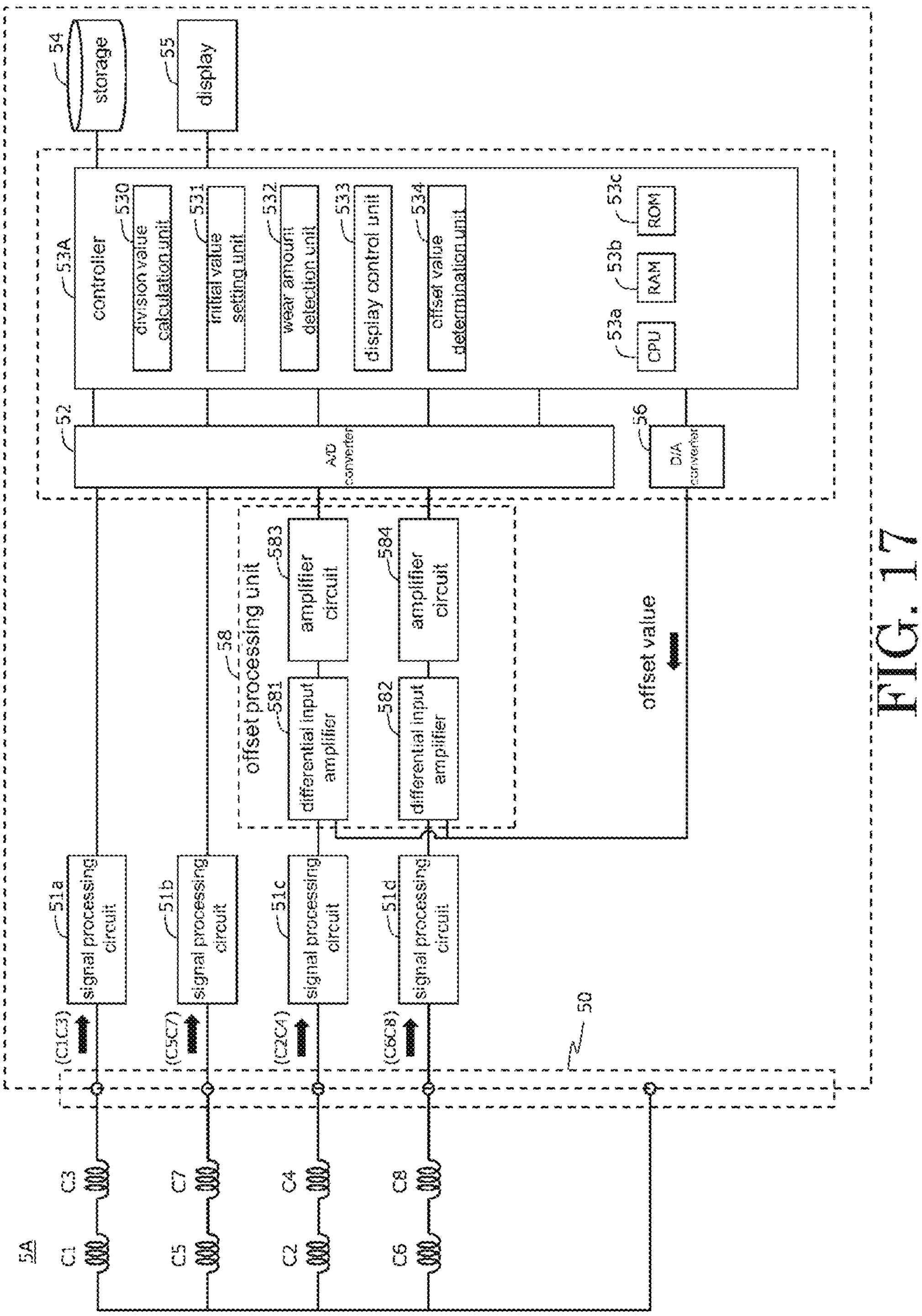
FIG. 17 is a functional block diagram illustrating another embodiment of the motor bearing wear monitoring device according to the present invention.

FIG. 17 is a functional block diagram illustrating the another embodiment (the second embodiment) of the present device.

A present device 5A includes the eight detection coils C1 to C8, the connection 50, the signal processing circuits 51*a* to 51*d*, the A/D converter 52, a controller 53A, the storage 54, the display 55, the D/A converter 56, and the offset processing unit 58. The A/D converter 52, the controller 53A, and the D/A converter 56 are implemented by a microcomputer, for example.

The controller 53A controls the operation of the whole present device 5A. The controller 53A includes, for example, a processor such as a CPU 53*a*, a volatile memory such as the RAM 53*b* that functions as a working area for the CPU 53*a*, and a non-volatile memory such as the ROM 53*c* that stores various kinds of information such as the present program and other control programs. The controller 53A includes the division value calculation unit 530, the initial value setting unit 531, the wear amount detection unit 532, the display control unit 533, and an offset value determination unit 534.

In the controller 53A, the present program operates, and the present program cooperates with the hardware resources of the present device 5A and achieves the present method described later. By causing the processor (the CPU 53*a*) included in the controller 53A to execute the present program, the present program enables the processor to function as the division value calculation unit 530, the initial value setting unit 531, the wear amount detection unit 532, the display control unit 533, and the offset value determination unit 534 and enables the processor to execute the present method. Herein, the present program may be stored in a non-transitory storage medium, e.g., a compact disc (CD), a digital versatile disc (DVD), a universal serial bus (USB) memory, etc., in an installable file format or an executable file format and provided to the present device 5A via a dedicated reading medium.

The offset value determination unit 534 determines the offset value, based on the signal voltage of the combined signal C2C4, the signal voltage of the combined signal C6C8, and the input voltage range of the A/D converter 52. A specific operation of the offset value determination unit 534 will be described later.

The "offset value" is a voltage value that is subtracted from each of the combined signals C2C4 and C6C8 in the offset processing unit 58 in such a way that a range close to the full scale of the input voltage range of the A/D convertor 52 is used in the digital conversion of each of the combined signals C2C4 and C6C8 to be used for calculating the division value.

The offset processing unit 58 executes second offset processing for subtracting the offset value from each of the combined signals C2C4 and C6C8, amplifies each of the combined signals C2C4 and C6C8 after the second offset processing, and outputs the amplified combined signals. The offset processing unit 58 includes differential input amplifiers 581 and 582 and amplifier circuits 583 and 584. The offset processing unit 58 is an example of the differential amplifier in the present invention.

The differential input amplifier 581 is connected to the signal processing circuit 51*c* and the D/A convertor 56, subtracts the offset value from the combined signal C2C4, amplifies the combined signal C2C4 after the subtraction to a predetermined factor, and outputs the amplified combined signal. The differential input amplifier 582 is connected to the signal processing circuit 51*d* and the D/A convertor 56, subtracts the offset value from the combined signal C6C8, amplifies the combined signal C6C8 after the subtraction to a predetermined factor, and outputs the amplified combined signal. The amplifier circuit 583 is connected to the differential input amplifier 581, amplifies the combined signal C2C4 after the processing of the differential input amplifier 581 to a predetermined factor, and outputs the amplified combined signal to the A/D converter 52. The amplifier circuit 584 is connected to the differential input amplifier 582, amplifies the combined signal C6C8 after the processing of the differential input amplifier 582 to a predetermined factor, and outputs the amplified combined signal to the A/D converter 52. In the present embodiment, the amplification factors of the differential input amplifiers 581 and 582 and the amplifier circuits 583 and 584 can be switched among several stages, for example, three stages of one time, two times, and four times. In this case, the amplification factor of the offset processing unit 58 can be switched to one time, two times, four times, eight times, and sixteen times, for example. The amplification factor of the offset processing unit 58 is controlled by the control unit 53A (the offset value determination unit 534), for example.

Operation of Canned Motor Pump (Motor Bearing Wear Monitoring Device (2))

Next, operations of the canned motor pump 1 will be described below with a focus on operations of the present device 5A. In the following description, FIGS. 1 to 3, FIGS. 4 to 13, and FIG. 16 will be referred to as appropriate.

The present device 5A executes, at a predetermined timing, initial value setting processing (S3) instead of the initial value setting processing (S1) of the first embodiment. When the canned motor pump 1 is in operation, the present device 5A executes wear amount detection processing (S4) on a regular basis (e.g., every 1 sec), instead of the wear amount detection processing (S2) in the first embodiment.

Initial Value Setting Processing

Figure 18:
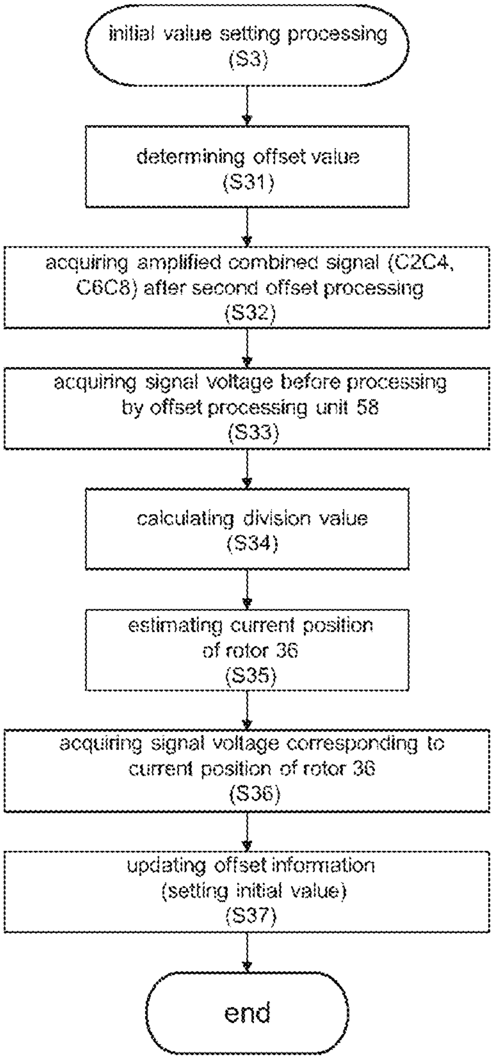
FIG. 18 is a flowchart illustrating an example of initial value setting processing included in an operation of the motor bearing wear monitoring device in FIG. 17.

FIG. 18 is a flowchart of the initial value setting processing (S3).

The "initial value setting processing (S3)" is processing in which the present device 5A determines the offset value, acquires the division value, and acquires and sets the initial value, based on the division value, at a predetermined timing. In the present embodiment, the initial value setting processing (S3) is an example of the present method.

As a preliminary step of the initial value setting processing (S3), the canned motor pump 1 is supplied with a power source under a predetermined driving condition and the rotor 36 rotates. In this case, the bearings 32 and 33 are in the unworn state, and the rotor 36 is located at the initial position. The amplification factor of the offset processing unit 58 is set to one time, for example. The detection signals (each combined signal C2C4, C6C8) from the detection coils C2, C4, C6, and C8 that detect the displacement in the thrust direction are converted from alternating current to direct current in the signal processing circuits 51*c* and 51*d*, converted from analog signals to digital signals in the A/D converter 52, and input to the controller 53A (the offset value determination unit 534).

Note that, in the initial value setting processing (S3), the liquid fed by the canned motor pump 1 is not limited to actual handling liquid and may be water. The canned motor pump 1 does not need to feed liquid and the motor unit 3 may idle. The driving condition may be any condition that allows the canned motor pump 1 to operate normally and is not limited to the rated condition.

First, the offset value determination unit 534 determines the offset value, based on the signal voltage of the combined signal C2C4, the signal voltage of the combined signal C6C8, the input voltage range of the A/D convertor 52, and the amplification factor of the offset processing unit 58 (S31). The offset value determination unit 534 fixes the amplification factor of the offset processing unit 58 to the maximum (four times×four times=sixteen times in the present embodiment) and increases the offset value in steps, thereby determining, as the optimal offset value, the offset value that ensures the A/D converter 52 does not reach saturation. Specifically, the offset value determination unit 534 determines the offset value "Vy" by using the following expression (4), for example.

$$(Vx - Vy) \times A < Vz \qquad \text{Expression (4)}$$

In the expression (4), "Vx" is the value of the signal voltage, i.e., the voltage value, of the combined signal (C2C4, C6C8), "A" is the amplification factor of the offset processing unit 58, and "Vz" is the input voltage range of the A/D convertor 52. Herein, the input voltage range is stored in the storage 54 in advance. For example, when "Vx" is "1.0 V", "Vz" is "5.0 V", and "A" is "16 times", Vy>0.69 is satisfied. In this case, the offset value determination unit 534 determines "16 times" as the amplification factor and determines "0.7 V" as the offset value, for example. The determined offset value is stored in the storage 54, converted from a digital signal to an analog signal in the D/A converter 56, and input to the differential input amplifiers 581 and 582 in the offset processing unit 58. The determined amplification factor of the offset processing unit 58 is stored in the storage 54 and is set in the offset processing unit 58.

Note that, in the present invention, the offset value determination unit 534 may determine the optimal offset value by switching the amplification factor of the offset processing unit 58 in addition to increasing the offset value.

Then, the offset processing unit 58 subtracts the offset value from each combined signal (C2C4, C6C8) (i.e., the second offset processing) and amplifies each combined signal (C2C4, C6C8) after the subtraction by a predetermined magnification (e.g., 16 times), thereby generating the amplified combined signal (C2C4, C6C8) after the second offset processing. Each of the generated combined signal (C2C4, C6C8) is converted from an analog signal to a digital signal in the A/D converter 52 and input to the controller 53A (the division value calculation unit 530).

Then, the division value calculation unit 530 refers to the amplification factor and the offset value that are stored in the storage 54 and acquires the signal voltage of each combined signal (C2C4, C6C8) before the processing by the offset processing unit 58 (S33). Specifically, the division value calculation unit 530 divides the signal voltage of each combined signal (C2C4, C6C8) by the amplification factor and adds the offset value to the signal voltage after the division.

Then, the division value calculation unit 530 divides the signal voltage of the combined signal (C2C4) by the signal voltage of the combined signal (C6C8), thereby calculating the division value (S34: division value calculation step).

Then, the initial value setting unit 531 refers to the first correspondence information stored in the storage 54 by using the calculated division value and acquires (estimates) the current position of the rotor 36 in the thrust direction with respect to the magnetic center (S35). Then, the initial value setting unit 531 refers to the second correspondence information stored in the storage 54 by using the acquired current position and acquires the voltage value corresponding to the current position of the rotor 36 (S36).

Then, the initial value setting unit 531 updates the offset information in the storage 54 with the acquired voltage value (S37: initial value setting step). As a result, the offset information (the initial value) is set to the acquired voltage value.

In this way, the present device 5A does not simply amplify each combined signal (C2C4, C6C8) depending on the input voltage range of the A/D converter 52, but amplifies each combined signal (C2C4, C6C8) after subtracting the offset value depending on the input voltage range. Thus, the present device 5A is able to amplify each combined signal (C2C4, C6C8) with an amplification factor larger than that in a case where the each combined signal (C2C4, C6C8) is simply amplified. As a result, in the present device 5A, the input voltage range of the A/D converter 52 apparently increases, and a range close to the full scale of the input voltage range of the A/D converter 52 can be used for the conversion of the combined signal (C2C4, C6C8). Accordingly, the quantization error in the A/D converter 52 decreases, and the calculation accuracy of the division value is improved.

Figure 19:
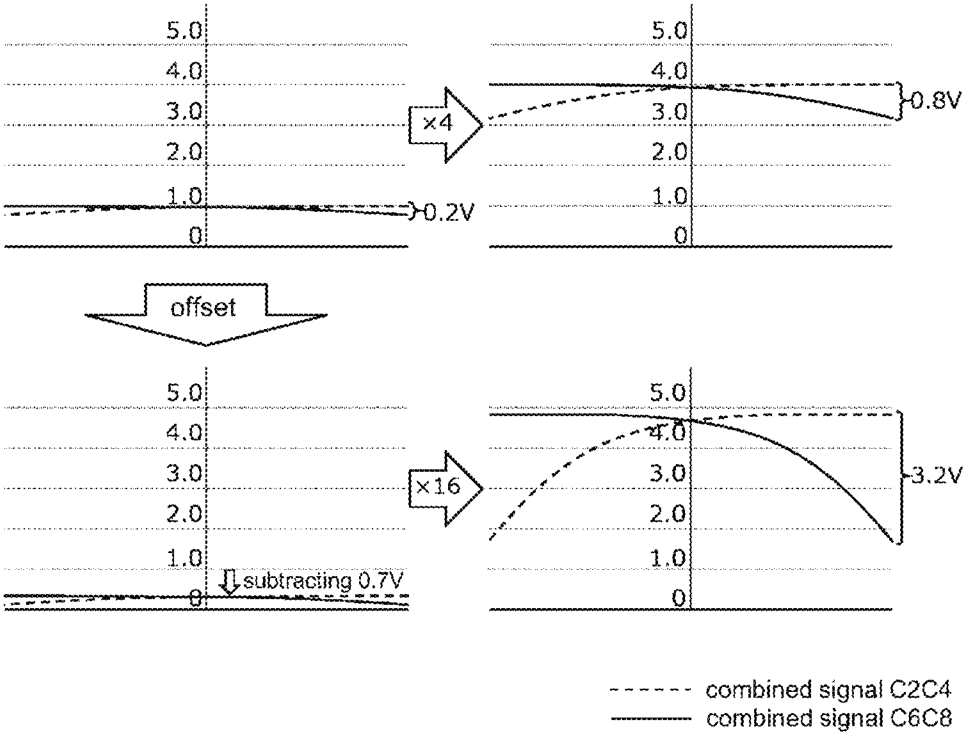
FIG. 19 is a schematic diagram illustrating an example of subtraction and amplification performed by an offset processing unit included in the motor bearing wear monitoring device in FIG. 17.

FIG. 19 is a schematic diagram illustrating an example of subtraction and amplification performed by the offset processing unit 58. The vertical axis of the figure indicates the voltage value of each combined signal (C2C4, C6C8), and the horizontal axis indicates the displacement amount of the rotor 36 in the thrust direction (the amount of wear of the bearings 32 and 33 in the thrust direction).

As illustrated in FIG. 19, the variation range of the voltage value of each combined signal (C2C4, C6C8) to be output from the signal processing circuits 51*c* and 51*d* is about 0.2 V. In this case, only a small part of the input voltage range of the A/D converter 52 is used for the conversion of each combined signal (C2C4, C6C8). The range used for the conversion in the resolution (12 bits) of the A/D converter 52 is only a few percent. In a case where each combined signal (C2C4, C6C8) is simply amplified depending on the input voltage range of the A/D converter 52, the amplification factor is limited to several times, and the variation range of the voltage value of each combined signal (C2C4, C6C8) after the amplification increases only to approximately 0.8 V, for example. In this case, the range of the resolution of the A/D converter 52 used for the conversion is approximately 20%. In contrast, after the subtraction by the offset value, the amplification factor can be increased to ten and several times, for example, and the variation range of the voltage value of each combined signal (C2C4, C6C8) after the amplification increases to approximately 3.2 V. As a result, the range of the resolution of the A/D converter 52 used for the conversion can be increased to approximately 65%.

Wear Amount Detection Processing

Figure 20:
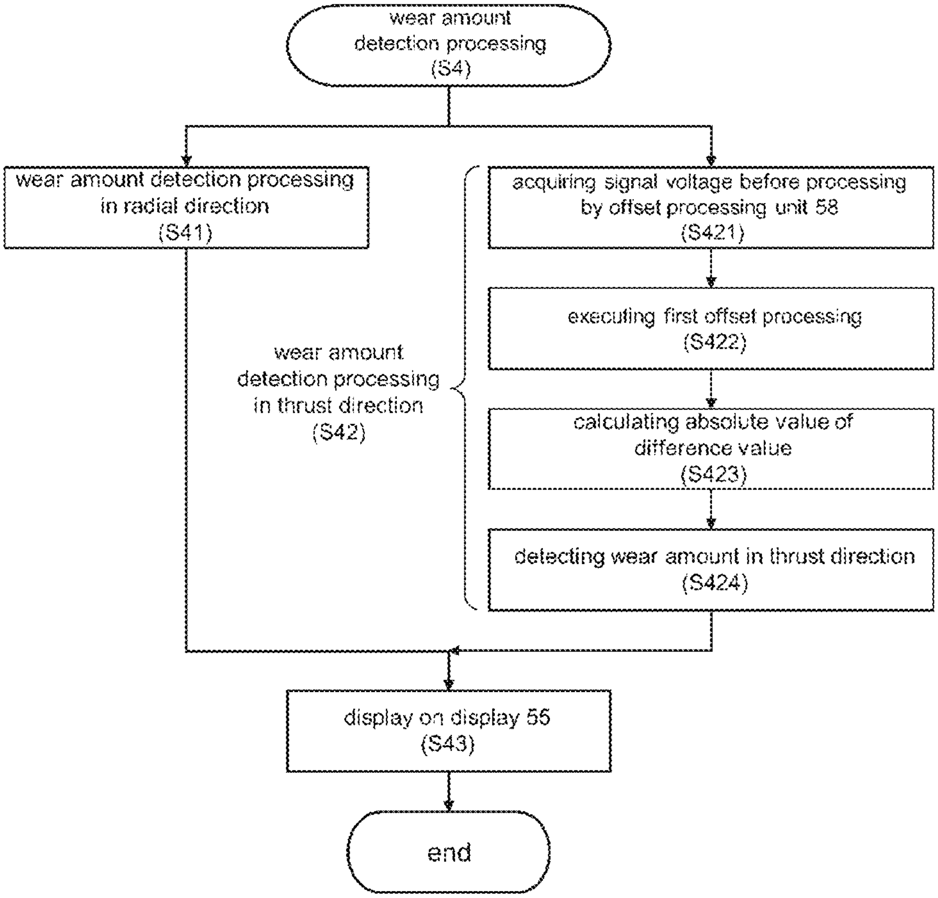
FIG. 20 is a flowchart illustrating an example of wear amount detection processing included in an operation of the motor bearing wear monitoring device in FIG. 17.

FIG. 20 is a flowchart of wear amount detection processing (S4).

In the wear amount detection processing (S4), the wear amount detection unit 532 individually executes wear amount detection processing in the radial direction (S41) and wear amount detection processing in the thrust direction (S42). Herein, since the wear amount detection processing in the radial direction (S41) is the same as the wear amount detection processing in the radial direction (S21) in the first embodiment, the details thereof will be omitted.

The present device 5A is different from the present device 5 in the first embodiment in that each combined signal (C2C4, C6C8) from the signal processing circuits 51*c* and 51*d* is input to the controller 53A (the wear amount detection unit 532) via the offset processing unit 58 at all time. Thus, the present device 5A executes, as the preprocessing in the wear amount detection processing in the thrust direction (S42), acquisition processing (S421) for acquiring the signal voltage of each combined signal (C2C4, C6C8) before the processing by the offset processing unit 58, first offset processing (S422) for the combined signal C2C4, and calculation processing (S423) for calculating the absolute value of the difference value between the combined signal C2C4 after the first offset processing and the combined signal C6C8.

In the processing (S421), the wear amount detection unit 532 refers to the amplification factor and the offset value that are stored in the storage 54 and acquires the signal voltage of each combined signal (C2C4, C6C8) before the processing by the offset processing unit 58, similarly to the processing (S33).

In the processing (S422), the wear amount detection unit 532 refers to the offset information stored in the storage 54 and executes the first offset processing for the signal voltage of the combined signal C2C4 acquired in the processing (S421).

In the processing (S423), the wear amount detection unit 532 calculates the absolute value of the difference value between the combined signal C2C4 after the first offset processing and the combined signal C6C8.

After the preprocessing (S421 to S423), the wear amount detection unit 532 detects the amount of wear in the thrust direction (S424), similarly to the wear amount detection processing in the thrust direction (S22) in the first embodiment.

Note that, in the wear amount detection processing (S4), the controller 53A (the offset value determination unit 534) may set the amplification factor of the offset processing unit 58 to "one time" and determine the offset value to "0" in advance, e.g., when the initial value setting processing (S3) ends. In this case, the wear amount detection unit 532 does not execute the processing (S421).

Then, the display control unit 533 determines a display mode of the display 55, based on the detected amount of wear, and controls a display on the display 55 in such a way that the display on the display 55 is performed in the determined display mode (S43).

Conclusion (2)

According to the embodiment described above, in the present device 5A, the driving condition of the test operation for setting the initial value can be freely set (for example, idling may be used), work effort and time required for the test operation are reduced, and the setting of the initial value is facilitated, similarly to the present device 5 in the first embodiment.

According to the embodiment described above, the present device 5A includes the offset processing unit 58 and the A/D converter 52. The offset processing unit 58 subtracts a predetermined offset value from each combined signal (C2C4, C6C8) and amplifies each combined signal (C2C4, C6C8) after the subtraction. The A/D converter 52 converts each amplified combined signal (C2C4, C6C8) from an analog signal to a digital signal. The offset value is determined depending on the input voltage range of the A/D converter 52. According to this configuration, the present device 5A is able to amplify each combined signal after subtracting the offset value, according to the input voltage range of the A/D converter 52. Thus, the present device 5A is able to amplify each combined signal (C2C4, C6C8) with the amplification factor larger than that in a case where each combined signal (C2C4, C6C8) is simply amplified. As a result, the quantization error in the A/D converter 52 decreases, and the calculation accuracy of the division value is improved.

According to the embodiment described above, the present device 5A includes the offset value determination unit 534 that determines the offset value, based on the signal voltage of the combined signal C2C4, the signal voltage of the combined signal C6C8, and the input voltage range of the A/D converter 52. According to this configuration, the present device 5A is able to automatically determine the offset value depending on the signal voltage of each combined signal (C2C4, C6C8).

Note that, in the present invention, the variation range of the signal voltage in the combined signal (C2C4, C6C8) is a value known to some extent for each model of the canned motor pump 1 (e.g., approximately 0.7 V to 1.0 V). Thus, the amplification factor of the differential input amplifiers 581 and 582 may be a fixed value (e.g., 4 times) set in advance for each model. In this case, the amplification factor of the amplifier circuits 583 and 584 may be switchable or may be a fixed value corresponding to a preset offset value.

In the present invention, the offset value may be set in advance for each model of the canned motor pump 1. In this case, the offset processing unit 58 may have a circuit configuration in which the amplification factor is linearly variable, for example. In this case, the present device 5A need not include the offset value determination unit 534.

In the present invention, the offset processing unit 58 need not include the amplifier circuits 583 and 584.

OTHER EMBODIMENTS

Note that, in the embodiments described above, the division value may be set as the initial value.

In the embodiments described above, the present device (5, 5A) (the wear amount detection unit 532) may detect the amount of wear in the thrust direction, based on the division value. That is, for example, the present device (5, 5A) detects the amount of wear in the thrust direction, based on the ratio of the calculated division value to the division value (the maximum division value) corresponding to the maximum displacement amount of the bearings 32 and 33 in the thrust direction on the front side (or on the rear side). In this case, the maximum division value is measured in advance and stored in the storage 54. In this configuration, as described above, the variation patterns of the division values are identical regardless of the driving condition. Thus, even though the driving condition is changed, the present device (5, 5A) is able to accurately detect the amount of wear in the thrust direction.

In the embodiments described above, the present device (5, 5A) (the wear amount detection unit 532) may detect the amount of wear in the thrust direction, based on the division value and the first correspondence information. In this case, the present device (5, 5A) acquires the current position of the rotor 36, based on the division value and the first correspondence information, and detects (estimates) the amount of wear, based on the current position, instead of the absolute value of the difference value.

In the first embodiment described above, the present device 5 may include the offset value determination unit 534 and the offset processing unit 58 in the second embodiment.

In the embodiments described above, the center of the rotor 36 in the thrust direction at the initial position of the rotor 36 need not coincide with the center of the stator 37 due to manufacturing errors, position tolerances, and the like. That is, for example, in the initial position, the rotor 36 may be disposed with being dislocated to the thrust direction with respect to stator 37.

In the embodiments described above, the number of the detection coils C1 to C8 is not limited to "eight" as long as the present invention can be implemented.

In the embodiments described above, the controller (53, 53A) may include a processor such as a digital signal processor (DSP), a micro processing unit (MPU), or the like, instead of the CPU 53*a*.

Aspects of the Present Invention

Next, aspects of the present invention conceived from the embodiments described above will be described below with reference to the terms and reference signs described in the embodiments.

A first aspect of the present invention is a motor bearing wear monitoring device (e.g., the present devices 5, 5A) for monitoring a wear state of bearings (e.g., the bearings 32 and 33) that support a rotating shaft (e.g., the rotating shaft 31) of a rotor (e.g., the rotor 36) by detecting a change in magnetic flux corresponding to a mechanical position change of the rotor with respect to a stator (e.g., the stator 37) of a motor (e.g., the motor unit 3) in a canned motor pump (e.g., the canned motor pump 1) by using a plurality of detection coils (e.g., the detection coils C1 to C8) attached to the stator, in which the plurality of detection coils includes a plurality of thrust detection coils (e.g., the detection coils C2, C4, C6, and C8) that output the detection signals indicating the change in the magnetic flux in the thrust direction of the rotating shaft, and the motor bearing wear monitoring device includes a division value calculation unit (e.g., the division value calculation unit 530) that calculates a division value by dividing a signal voltage of a first combined signal (e.g., the combined signal C2C4) obtained by combining the detection signals output from each of a pair of the thrust detection coils (e.g., the detection coils C2 and C4) by a signal voltage of a second combined signal (e.g., the combined signal C6C8) obtained by combining the detection signals output from each of another pair of the thrust detection coils (e.g., the detection coils C6 and C8) among the plurality of thrust detection coils, or by dividing the signal voltage of the second combined signal by the signal voltage of the first combined signal; and an initial value setting unit (e.g., the initial value setting unit 531) that sets an initial value indicating a position of the rotor in an unworn state, based on the division value at the initial position, the initial position being a position of the rotor in the thrust direction in the unworn state in which the bearings are not worn. According to this configuration, the driving condition of the test operation for setting the initial value can be freely set, work effort and time required for the test operation are reduced, and the setting of the initial value is facilitated.

A second aspect of the present invention is the motor bearing wear monitoring device in the first aspect, further including a storage (e.g., the storage 54) that stores first correspondence information indicating a correspondence between the division value and a position of the rotor in the thrust direction, in which the initial value setting unit sets the initial value, based on the division value calculated by the division value calculation unit and the first correspondence information. According to this configuration, the present device is able to accurately estimate the current position of the rotor 36 in the thrust direction with respect to the magnetic center and the current position of the magnetic center with respect to the position of the rotor 36, regardless of the driving condition.

A third aspect of the present invention is the motor bearing wear monitoring device in the second aspect, in which the storage stores second correspondence information indicating a correspondence between a difference value between the signal voltage of the first combined signal and the signal voltage of the second combined signal and a position of the rotor in the thrust direction, and the initial value setting unit sets the initial value, based on the division value calculated by the division value calculation unit, the first correspondence information, and the second correspondence information. According to this configuration, the present device is able to accurately detect the wear amount corresponding to a reference driving condition by offsetting voltage values of two combined signals by using an initial value in such a way that an absolute value (the voltage value) of a difference value between the two combined signals become “0” at the initial position.

A fourth aspect of the present invention is the motor bearing wear monitoring device in the third aspect, further including a wear amount detection unit (e.g., the wear amount detection unit 532) that detects the wear amount of the bearings in the thrust direction, based on the difference value and the second correspondence information. According to this configuration, the present device is able to detect the accurate wear amount under the reference driving condition corresponding to the second correspondence information.

A fifth aspect of the present invention is the motor bearing wear monitoring device in the second aspect, further including a wear amount detection unit (e.g., the wear amount detection unit 532) that detects the wear amount of the bearings in the thrust direction, based on the division value and the first correspondence information. According to this configuration, the present device is able to detect the amount of wear of the bearings in the thrust direction, regardless of the driving condition.

A sixth aspect of the present invention is the motor bearing wear monitoring device (e.g., the present device 5A) in any one of the first to fifth aspects, further including a differential amplifier (e.g., offset processing unit 58) that subtracts a predetermined offset value from each of the first combined signal and the second combined signal and amplifies each of the first combined signal and the second combined signal after the subtraction; and an A/D converter (e.g., the A/D converter 52) that converts each of the first combined signal and the second combined signal after the amplification into digital signals, in which the offset value is determined depending on an input voltage range of the A/D converter. According to this configuration, the present device is able to amplify the combined signal after subtracting the offset value, according to the input voltage range of the A/D converter. As a result, the quantization error in the A/D converter decreases, and the calculation accuracy of the division value is improved.

A seventh aspect of the present invention is the motor bearing wear monitoring device in the sixth aspect, further including an offset value determination unit (e.g., the offset value determination unit 534) that determines the offset value, based on the signal voltage of the first combined signal, the signal voltage of the second combined signal, and the input voltage range. According to this configuration, the present device is able to automatically determine the offset value depending on the signal voltage of each combined signal.

A eighth aspect of this present invention is a setting method for a motor bearing wear monitoring device for monitoring a wear state of bearings that support a rotating shaft of a rotor by detecting a change in magnetic flux corresponding to a mechanical position change of the rotor with respect to a stator of a motor in a canned motor pump by using a plurality of detection coils attached to the stator, in which the plurality of detection coils includes a plurality of thrust detection coils that output the detection signals indicating the change in the magnetic flux in the thrust direction of the rotating shaft, and the setting method includes: a division value calculation step (e.g., the processing (S11, S34)) of calculating a division value by dividing a signal voltage of a first combined signal obtained by combining the detection signals output from each of a pair of the thrust detection coils by a signal voltage of a second combined signal obtained by combining the detection signals output from each of another pair of the thrust detection coils among the plurality of thrust detection coils, or by dividing the signal voltage of the second combined signal by the signal voltage of the first combined signal; and an initial value setting step (e.g., the processing (S14, S37)) of setting an initial value indicating a position of the rotor in an unworn state, based on the division value at the initial position, the initial position being a position of the rotor in the thrust direction in the unworn state in which the bearings are not worn. According to this configuration, the driving condition of the test operation for setting the initial value can be freely set, work effort and time required for the test operation are reduced, and the setting of the initial value is facilitated.

A ninth aspect of the present invention is a setting program to be executed by a processor (e.g., CPU 53*a*) included in a motor bearing wear monitoring device for monitoring a wear state of bearings that support a rotating shaft of a rotor by detecting a change in magnetic flux corresponding to a mechanical position change of the rotor with respect to a stator of a motor in a canned motor pump by using a plurality of detection coils attached to the stator, in which the plurality of detection coils includes a plurality of thrust detection coils that output the detection signals indicating the change in the magnetic flux in the thrust direction of the rotating shaft, and the setting program causes the processor to function as: a division value calculation unit that calculates a division value by dividing a signal voltage of a first combined signal obtained by combining the detection signals output from each of a pair of the thrust detection coils by a signal voltage of a second combined signal obtained by combining the detection signals output from each of another pair of the thrust detection coils among the plurality of thrust detection coils, or by dividing the signal voltage of the second combined signal by the signal voltage of the first combined signal; and an initial value setting unit that sets an initial value indicating a position of the rotor in an unworn state, based on the division value at the initial position, the initial position being a position of the rotor in the thrust direction in the unworn state in which the bearings are not worn. According to this configuration, the driving condition of the test operation for setting the initial value can be freely set, work effort and time required for the test operation are reduced, and the setting of the initial value is facilitated.

REFERENCE SIGNS LIST

1 Canned motor pump
3 Motor unit (Motor)
32 Bearing
33 Bearing
36 Rotor
37 Stator
5 Motor bearing wear monitoring device
52 A/D converter
530 Division value calculation unit
531 Initial value setting unit
532 Wear amount detection unit
54 Storage
5A Motor bearing wear monitoring device
534 Offset value determination unit
58 Offset processing unit (Differential amplifier)
C1 to C8 Detection coil

The invention claimed is:

1. A motor bearing wear monitoring device for monitoring a wear state of bearings that support a rotating shaft of a rotor by detecting a change in magnetic flux corresponding to a mechanical position change of the rotor with respect to a stator of a motor in a canned motor pump by using a plurality of detection coils attached to the stator, wherein the plurality of detection coils includes a plurality of thrust detection coils that output the detection signals indicating the change in the magnetic flux in the thrust direction of the rotating shaft, the motor bearing wear monitoring device comprising:

a division value calculation unit configured to calculate a division value by dividing a signal voltage of a first combined signal obtained by combining the detection signals output from each of a pair of the thrust detection coils by a signal voltage of a second combined signal obtained by combining the detection signals output from each of another pair of the thrust detection coils among the plurality of thrust detection coils, or by dividing the signal voltage of the second combined signal by the signal voltage of the first combined signal; and an initial value setting unit configured to set an initial value indicating a position of the rotor in an unworn state, based on the division value at the initial position, the initial position being a position of the rotor in the thrust direction in the unworn state in which the bearings are not worn.

2. The motor bearing wear monitoring device according to claim 1 Further comprising a storage that stores first correspondence information indicating a correspondence between the division value and a position of the rotor in the thrust direction, wherein the initial value setting unit sets the initial value, based on the division value calculated by the division value calculation unit and the first correspondence information.

3. The motor bearing wear monitoring device according to claim 2, wherein the storage stores second correspondence information indicating a correspondence between a difference value between the signal voltage of the first combined signal and the signal voltage of the second combined signal and a position of the rotor in the thrust direction, and the initial value setting unit sets the initial value, based on the division value calculated by the division value calculation unit, the first correspondence information, and the second correspondence information.

4. The motor bearing wear monitoring device according to claim 3 further comprising a wear amount detection unit configured to detect the wear amount of the bearings in the thrust direction, based on the difference value and the second correspondence information.

5. The motor bearing wear monitoring device according to claim 2 further comprising a wear amount detection unit configured to detect the wear amount of the bearings in the thrust direction, based on the division value and the first correspondence information.

6. The motor bearing wear monitoring device according to claim 1, further comprising:

differential amplifier configured to subtract a predetermined offset value from each of the first combined signal and the second combined signal and amplifies each of the first combined signal and the second combined signal after the subtraction; and an A/D converter configured to convert each of the first combined signal and the second combined signal after the amplification into digital signals, wherein the offset value is determined depending on an input voltage range of the A/D converter.

7. The motor bearing wear monitoring device according to claim 6 further comprising an offset value determination unit configured to determine the offset value, based on the signal voltage of the first combined signal, the signal voltage of the second combined signal, and the input voltage range.

8. A setting method for a motor bearing wear monitoring device for monitoring a wear state of bearings that support a rotating shaft of a rotor by detecting a change in magnetic flux corresponding to a mechanical position change of the rotor with respect to a stator of a motor in a canned motor pump by using a plurality of detection coils attached to the stator, wherein the plurality of detection coils includes a plurality of thrust detection coils that output the detection signals indicating the change in the magnetic flux in the thrust direction of the rotating shaft, the setting method comprising:

a division value calculation step of calculating a division value by dividing a signal voltage of a first combined signal obtained by combining the detection signals output from each of a pair of the thrust detection coils by a signal voltage of a second combined signal obtained by combining the detection signals output from each of another pair of the thrust detection coils among the plurality of thrust detection coils, or by dividing the signal voltage of the second combined signal by the signal voltage of the first combined signal; and an initial value setting step of setting an initial value indicating a position of the rotor in an unworn state, based on the division value at the initial position, the initial position being a position of the rotor in the thrust direction in the unworn state in which the bearings are not worn.

9. A non-transitory storage medium storing a setting program executable on a processor included in a motor bearing wear monitoring device for monitoring a wear state of bearings that support a rotating shaft of a rotor by detecting a change in magnetic flux corresponding to a mechanical position change of the rotor with respect to a stator of a motor in a canned motor pump by using a plurality of detection coils attached to the stator, wherein the plurality of detection coils includes a plurality of thrust detection coils that output the detection signals indicating the change in the magnetic flux in the thrust direction of the rotating shaft, the setting program causing the processor to function as:

a division value calculation unit configured to calculate a division value by dividing a signal voltage of a first combined signal obtained by combining the detection signals output from each of a pair of the thrust detection coils by a signal voltage of a second combined signal obtained by combining the detection signals output from each of another pair of the thrust detection coils among the plurality of thrust detection coils, or by dividing the signal voltage of the second combined signal by the signal voltage of the first combined signal; and an initial value setting unit configured to set an initial value indicating a position of the rotor in an unworn state, based on the division value at the initial position, the initial position being a position of the rotor in the thrust direction in the unworn state in which the bearings are not worn.

* * * * *